(12) United States Patent
Franklin

(10) Patent No.: US 10,905,026 B2
(45) Date of Patent: Jan. 26, 2021

(54) INTEGRATION CELL FOR SEISMIC ELECTRONIC EQUIPMENT RACK AND METHOD OF TRANSPORTING ELECTRONIC EQUIPMENT UNITS THEREBY

(71) Applicant: ARA USA LLC, Reno, NV (US)

(72) Inventor: Barrett W. Franklin, Reno, NV (US)

(73) Assignee: ARA USA, LLC, Reno, NV (US)

(*) Notice: Subject to any disclaimer, the term of this patent is extended or adjusted under 35 U.S.C. 154(b) by 0 days.

(21) Appl. No.: 15/632,272

(22) Filed: Jun. 23, 2017

(65) Prior Publication Data

US 2017/0290193 A1 Oct. 5, 2017

Related U.S. Application Data

(63) Continuation-in-part of application No. 15/387,994, filed on Dec. 22, 2016, now Pat. No. 10,531,591, which is a continuation of application No. 14/549,074, filed on Nov. 20, 2014, now Pat. No. 9,532,484.

(Continued)

(51) Int. Cl.
| | |
|---|---|
| *H05K 7/20* | (2006.01) |
| *H05K 7/14* | (2006.01) |
| *H05K 7/18* | (2006.01) |
| *A47B 87/02* | (2006.01) |

(52) U.S. Cl.
CPC ....... *H05K 7/1495* (2013.01); *A47B 87/0276* (2013.01); *H05K 7/18* (2013.01); *H05K 7/183* (2013.01); *H05K 7/20709* (2013.01); *H05K 7/20736* (2013.01)

(58) Field of Classification Search
CPC .... H05K 7/18; H05K 7/20736; H05K 7/1495; H05K 7/20709; H05K 7/1488; H05K 5/0021; A47B 47/024; A47B 47/03; A47B 47/0083; A47B 47/027; A47B 87/0276; Y10T 29/49904
USPC .......... 361/725, 728, 729, 730, 731; 29/428, 29/469; 312/198, 265.1; 211/26, 153
See application file for complete search history.

(56) References Cited

U.S. PATENT DOCUMENTS

| | | |
|---|---|---|
| 2,710,784 A | 6/1955 | Morin |
| 3,851,764 A | 12/1974 | Anders |

(Continued)

FOREIGN PATENT DOCUMENTS

WO 2011000431 1/2011

OTHER PUBLICATIONS

Extended European Search Report for 14864682.1, dated Aug. 23, 2017.

(Continued)

*Primary Examiner* — Michael Safavi
(74) *Attorney, Agent, or Firm* — Steven R. Vosen

(57) ABSTRACT

Described herein is an integration cell that can be pre-installed with plural electronic equipment units at a location remote from a datacenter. One or more pre-installed integration cells can be shipped on a single standard shipping palette to the datacenter location and moved into the datacenter through standard doorways and using standard elevators. Inside the datacenter, the integration cell can be inserted into a seismic electronic equipment storage rack to allow for bulk installation or removal of plural electronic equipment units.

20 Claims, 24 Drawing Sheets

Related U.S. Application Data

(60) Provisional application No. 61/906,566, filed on Nov. 20, 2013, provisional application No. 62/354,620, filed on Jun. 24, 2016.

(56) References Cited

U.S. PATENT DOCUMENTS

| | | | |
|---|---|---|---|
| 4,949,648 A | 8/1990 | Miller | |
| 5,443,312 A | 8/1995 | Schluter | |
| 5,602,366 A | 2/1997 | Whelan et al. | |
| 5,901,033 A | 5/1999 | Crawford et al. | |
| 5,938,302 A | 8/1999 | Anderson et al. | |
| 6,075,698 A * | 6/2000 | Hogan | H05K 7/20581 165/104.34 |
| 6,185,098 B1 | 2/2001 | Benavides | |
| 6,257,427 B1 | 7/2001 | Schneid | |
| 6,288,902 B1 * | 9/2001 | Kim | G11B 33/08 206/701 |
| 6,293,637 B1 | 9/2001 | Anderson et al. | |
| 6,310,783 B1 * | 10/2001 | Winch | H01M 2/1077 361/679.02 |
| 6,324,062 B1 | 11/2001 | Treiber | |
| 6,336,691 B1 * | 1/2002 | Maroney | H05K 7/20127 312/213 |
| 6,836,030 B2 | 12/2004 | Smith et al. | |
| 6,842,334 B2 | 1/2005 | Smith et al. | |
| 6,909,611 B2 | 6/2005 | Smith et al. | |
| 6,955,271 B1 | 10/2005 | Stallings | |
| 7,123,485 B1 * | 10/2006 | Henderson | H01M 2/1005 361/724 |
| 7,193,856 B2 * | 3/2007 | Hidaka | G11B 33/126 211/190 |
| 7,304,855 B1 * | 12/2007 | Milligan | G11B 33/128 361/724 |
| 7,379,305 B2 * | 5/2008 | Briggs | G06F 1/181 361/727 |
| 7,408,772 B2 | 8/2008 | Grady et al. | |
| 7,420,805 B2 | 9/2008 | Smith et al. | |
| 7,548,429 B2 * | 6/2009 | Miller | H01M 2/1077 361/724 |
| 7,558,074 B2 * | 7/2009 | Liang | G06F 1/183 174/50 |
| 7,740,142 B2 * | 6/2010 | Miller | H01M 2/1077 211/26 |
| 7,898,117 B2 | 3/2011 | Bousseton et al. | |
| 8,144,464 B2 * | 3/2012 | VanDerVeen | H05K 7/20736 165/104.34 |
| 8,238,082 B2 * | 8/2012 | Salpeter | H05K 7/1488 361/679.02 |
| 8,561,814 B2 * | 10/2013 | Elwany | H05K 7/20736 211/26 |
| 8,668,283 B2 | 3/2014 | Fan et al. | |
| 8,873,235 B2 * | 10/2014 | Chen | H05K 7/20836 361/694 |
| 8,913,393 B2 | 12/2014 | Mimlitch | |
| 8,960,451 B2 | 2/2015 | Florence, Jr. | |
| 9,019,706 B2 * | 4/2015 | Ning | H05K 7/1492 312/223.2 |
| 9,049,802 B2 | 6/2015 | Yi et al. | |
| 9,185,975 B2 | 11/2015 | Franklin | |
| 9,456,519 B2 * | 9/2016 | Bailey | H05K 7/1488 |
| 9,888,616 B2 | 2/2018 | Yu et al. | |
| 10,172,453 B1 * | 1/2019 | Redfern | A47B 47/00 |
| 10,185,109 B2 * | 1/2019 | Zer | G02B 6/3897 |
| 2001/0029710 A1 | 10/2001 | Notohardjono et al. | |
| 2001/0036399 A1 | 11/2001 | Notohardjono et al. | |
| 2003/0062326 A1 | 4/2003 | Guebre-Tsadik | |
| 2003/0223193 A1 | 12/2003 | Smith et al. | |
| 2003/0223196 A1 | 12/2003 | Smith et al. | |
| 2004/0070227 A1 | 4/2004 | Pape et al. | |
| 2006/0243690 A1 * | 11/2006 | Mollard | B65D 19/44 211/151 |
| 2007/0283858 A1 | 12/2007 | Ballard | |
| 2008/0231151 A1 | 9/2008 | Barringer et al. | |
| 2009/0071916 A1 | 3/2009 | Becklin | |
| 2009/0277661 A1 | 11/2009 | Schell | |
| 2010/0116545 A1 | 5/2010 | Lewison | |
| 2012/0020011 A1 | 1/2012 | Chang | |
| 2012/0292278 A1 | 11/2012 | Schluter et al. | |
| 2013/0069501 A1 | 3/2013 | Liu | |
| 2014/0116971 A1 | 5/2014 | Bailey et al. | |
| 2014/0263129 A1 | 9/2014 | Tseng | |
| 2015/0136714 A1 | 5/2015 | Franklin | |
| 2015/0181748 A1 * | 6/2015 | Bailey | H05K 7/1488 361/679.58 |
| 2016/0107793 A1 | 4/2016 | Jiang | |

OTHER PUBLICATIONS

International Search Report and Written Opinion for PCT/US2014/066648, 12 pages.
International Search Report and Written Opinion for PCT/US17/39147 dated Nov. 6, 2017.
Lowell: "Lowell Seismic-certified Gangable Race"; Dec. 19, 2011.
Supplementary European Search Report dated Dec. 13, 2019, Beaudet, J, for 17816358.0.

\* cited by examiner

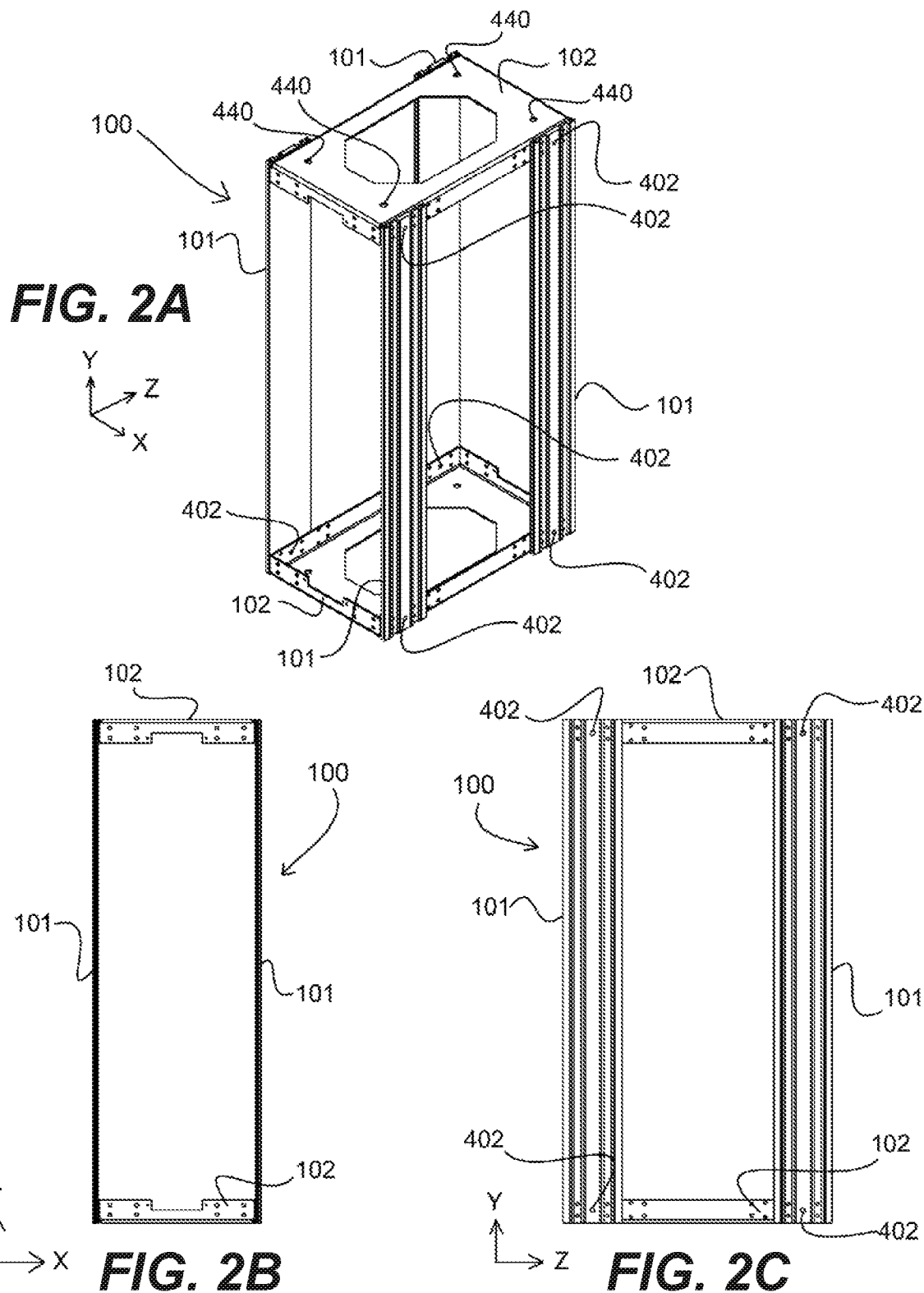

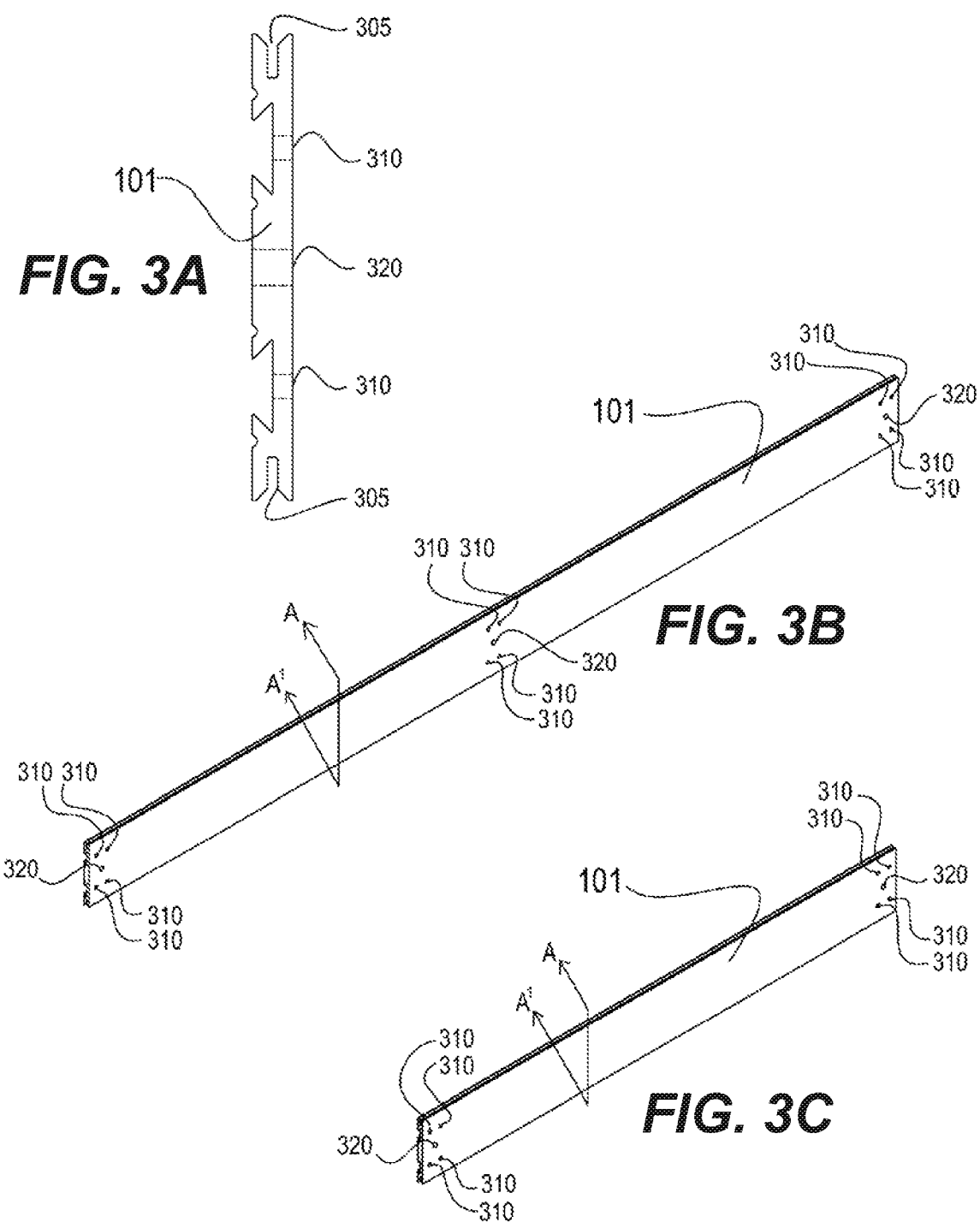

INTEGRATION CELL FOR SEISMIC ELECTRONIC EQUIPMENT RACK AND METHOD OF TRANSPORTING ELECTRONIC EQUIPMENT UNITS THEREBY

CROSS-REFERENCE TO RELATED APPLICATIONS

This application claims the benefit of U.S. Provisional Patent Application No. 62/354,620, filed on Jun. 24, 2016; and is a continuation-in-part of U.S. patent application Ser. No. 15/387,994, filed on Dec. 22, 2016 and which issued on Jan. 7, 2020 as U.S. Pat. No. 10,531,591, which is a continuation of U.S. patent application Ser. No. 14/549,074, filed on Nov. 20, 2014, which issued on Dec. 27, 2016 as U.S. Pat. No. 9,532,484, which claims priority to U.S. Provisional Patent Application No. 61/906,566, filed on Nov. 20, 2013, each of which is incorporated herein by reference in its entirety.

FIELD OF THE INVENTION

The present disclosure relates to high-density electronic equipment storage systems and electronic equipment storage management and more particularly relates to a system for removable storage units for electronic and non-electronic equipment that is placed in high-density electronic equipment racks.

RELATED ART

Datacenters are designed and constructed to optimize power and cooling requirements for a plurality of electric components such as power supplies, memory units, network appliances and servers. Since their introduction into datacenters, most of these electric devices have been adapted to fit into rack mountable electronic equipment chassis. Rack mountable electric equipment chassis are typically constructed of steel sheet metal which adds considerable weight and mass to the overall electric component. In datacenters, the steel appliance chassis housing the electronic equipment are then mounted into standardized equipment racks.

In general, equipment racks are produced in standard sizes such as "full height" that are approximately six feet in height, or "half high" racks that are approximately three feet in height. The equipment racks are designed to receive electronic appliances of variable height based upon a standardized scale referred to as the "Rack Unit", "RU" or "U", a unit of measure equal to 1.75 inches (44.45 mm). Thus, a standard full height 42 U equipment rack could store forty-two 1 U, or twenty-one 2 U electronic component appliance chassis. The 19" rack mounting fixture includes two parallel metal strips (commonly referred to as "posts", "panel mounts" and "rack rails") standing vertically. The posts are 0.625 inch (15.88 mm) wide, and are separated by a distance of 17.75 inches (450.85 mm) for the mounting of the electronic equipment chassis, thus providing a front plane appliance attachment width of 19 inches (482.6 mm) and effectively limiting the maximum width of equipment to 17.75" (450.85 mm) with a minimum height of 1 U or 1.75 inches (44.45 mm).

Known initially as "relay racks," electronic equipment racks were adapted by the computer industry from 19-inch switching and signaling equipment racks originally introduced by the telecommunications and railroad industry in the late 19th century. Electronic equipment racks initially included two posts and are, therefore, commonly known as "two-post racks." To accommodate larger electronic equipment, two sets of racks were implemented to support the front and back of larger electronic equipment chassis and are referred to as "four-post racks." Legacy datacenters were commonly constructed on a raised floor framework supporting 24" square removable floor tiles. Ultimately, four-post electronic equipment racks were integrated into steel box cabinets with a standardized width of 24" (600-610 mm) that also aligns with the layout of raised floor tiles. Legacy electronic equipment racks are typically 800 mm or 1000 mm in depth though specific depths vary from manufacturer to manufacturer. The industry standard four-post racks commonly found in datacenters today are typically enclosed in a steel cabinet and positioned in rows on 24-inch centers.

A difficulty of such a rack cabinet system is that the cabinet is typically shipped in assembled form with a significant cost of shipping at a fixed standard height to fit upright through the average door. This legacy equipment rack design effectively limits horizontal and vertical space utilization in the datacenter. It requires each 17.75-inch-wide stack of electronic equipment chassis to occupy a 24-inch width of horizontal floor space, and limits vertical space utilization to the height of the static equipment rack design, not the ceiling height or equipment density potential of the datacenter.

Many other difficulties exist within current rack cabinet architectures. Although the typical rack cabinet is made of a steel or aluminum box frame construction for strength to handle the static loads of legacy rack mounted equipment, current design approaches add significant width and mass to the front profile and footprint of the rack cabinet without addressing the additional dynamic load requirements of modern high density equipment, specifically in potentially high-seismic-activity geographic regions. The current design limitations not only affect the size, but also the total mass of existing rack cabinet systems, significantly impacting material usage and floor space utilization while failing to meet the potential dynamic load requirements in seismically active areas. Inversely, the current seismically engineered and rated racks that are available to address modern dynamic load requirements extend the mass and material usage of steel or aluminum box construction even further. This adds even more weight, mass, and cost to the rack cabinet system, without reducing the overall footprint, or increasing space utilization in the modern data center.

An additional difficulty is that the electric equipment destined to be housed in the rack cabinet system is separately shipped to the data center where each individual component is unpacked and individually installed in the rack and electrically connected. This is very labor intensive and time consuming. Furthermore, revisions to the data center are equally labor intensive and time consuming because each individual electronic equipment must be unwired and uninstalled from the rack to upgrade or replace the rack equipment.

Though much has changed in computing and telecommunications equipment over the past decades, there has been relatively little change in equipment rack design and to better address the densities and efficiencies of modern electronic equipment and how they are utilized. This not only affects the size, but also the total mass of existing rack cabinet systems, significantly impacting material usage and floor space utilization. As data centers adopt virtualization and cloud computing to achieve higher levels of efficiencies utilizing large arrays of dense homogeneous power-efficient equipment, the current art of rack cabinet equipment significantly limits more efficient datacenter designs as well as the utilization of space in existing facilities.

Therefore, what is needed is a system and method that overcomes these significant problems found in the conventional systems as described above.

SUMMARY

In order to solve the problems with the conventional systems, described herein is an integration cell that houses plural electronic equipment and can be inserted and removed from a modular electronic equipment storage rack. The integration cell is configured to support a plurality of electronic equipment units and provide a secure housing within which the electronic equipment units are secured. The housing additionally serves to protect the electronic equipment during shipment and provides a stable structure that is appropriately sized and shaped to be placed directly on a standard palette for shipping. This advantageously allows the data center to receive a pre-installed integration cell housing the desired number of electronic and non-electronic equipment units that can efficiently be installed in the rack to allow for bulk installation of additional and/or replacement electronic equipment units.

In one embodiment, the integration cell provides an improved and scalable datacenter configuration and allows plural electronic equipment units to be pre-installed in an integration cell by the electronic equipment provider and then shipped on a standard shipping palette to the datacenter. A significant advantage of the integration cell is the remote configuration and installation of electronic equipment units by the electronic equipment provider, which cannot be accomplished with conventional electronic equipment storage rack solutions. Advantageously, the integration cell is sized such that two integration cells can be secured on a single standard shipping palette. Additionally, the housing of the integration cell serves to align, anchor, and position the electronic equipment units inside the integration cell and also serves to protect the electronic equipment units during transportation by land, sea, or air.

When an integration cell arrives at the datacenter site, the integration cell can be easily moved into the datacenter using standard doorways and/or elevators so that it can be installed into an electronic equipment storage rack. Integration cells can advantageously be stacked in an electronic equipment storage rack to allow for higher density of the electronic equipment units. When the integration cell is installed into an electronic equipment storage rack, it can be secured to the vertical and/or horizontal components of the storage rack with screws or other fasteners. Additionally, installation of the integration cell into the storage rack may be accomplished by a lifting mechanism (mechanical or electronic or some combination) that elevates the integration cell to the appropriate height and inserts the integration cell into an opening in the modular electronic equipment storage rack.

Other features and advantages of the present invention will become more readily apparent to those of ordinary skill in the art after reviewing the following detailed description and accompanying drawings.

BRIEF DESCRIPTION OF THE DRAWINGS

The structure and operation of the present invention will be understood from a review of the following detailed description and the accompanying drawings in which like reference numerals refer to like parts and in which:

FIGS. 2A, 2B and 2C include a schematic perspective view, a schematic front view, and a schematic side view, respectively, of a building-block rack framework assembly, in accordance with some embodiments;

FIG. 3A includes a schematic cross-sectional view of an extruded vertical structural side member of a rack framework assembly, taken along line 3A-3A of FIG. 3B or line 3A-3A of FIG. 3C, in accordance with some embodiments;

FIG. 3B includes a schematic perspective view of an extruded vertical structural side member of a rack framework assembly, as illustrated in FIG. 3A, in accordance with some embodiments;

FIG. 3C includes a schematic perspective view of an extruded vertical structural side member of a rack framework assembly, as illustrated in FIG. 3A, in accordance with some embodiments;

DETAILED DESCRIPTION

Figure 1:
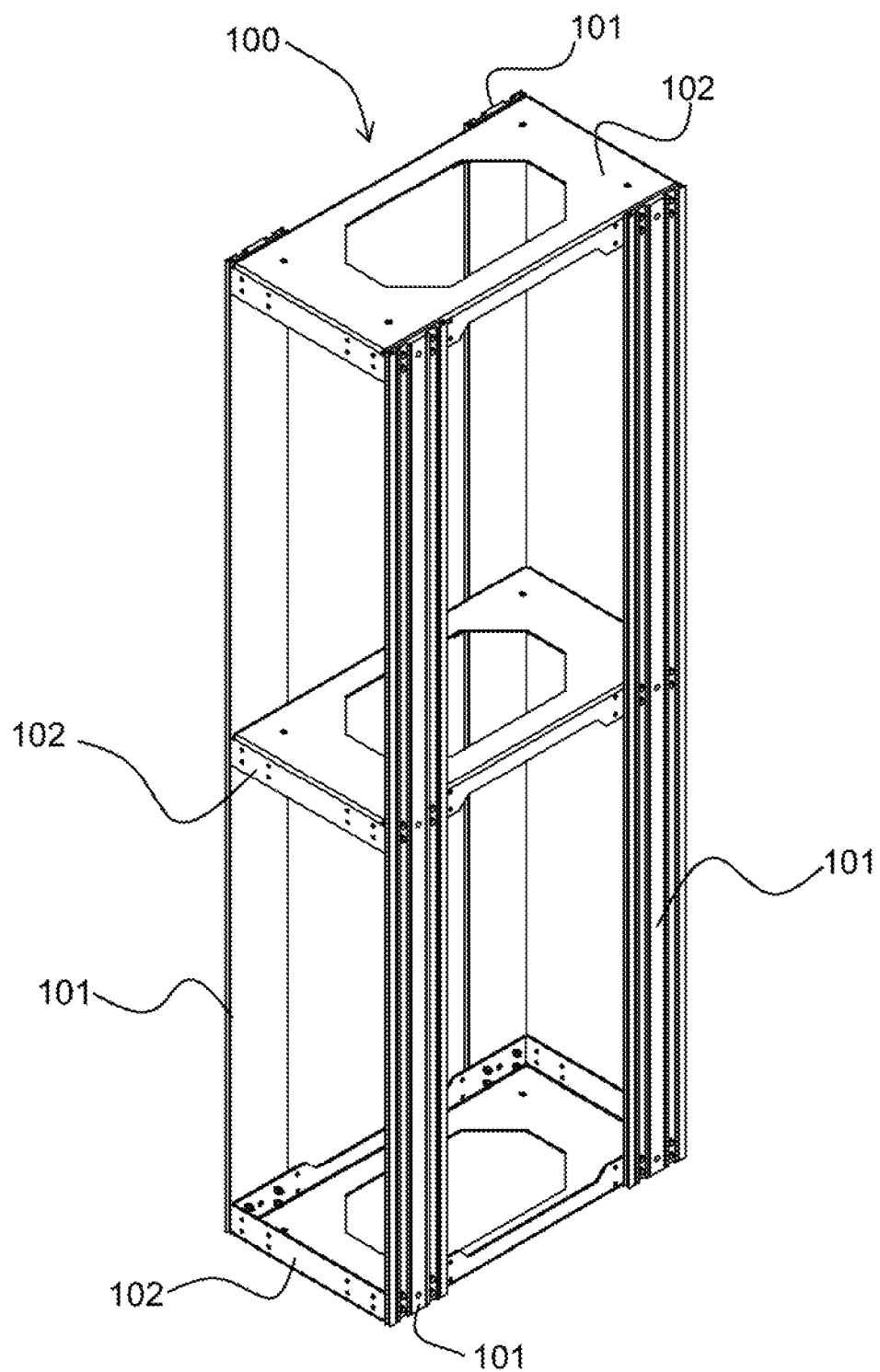
FIG. 1 includes a schematic perspective view of a building-block rack framework assembly, in accordance with some embodiments.

Certain embodiments disclosed herein provide for an integration cell that can be pre-installed with plural electronic equipment remote from a datacenter and can be shipped on standard shipping palettes to the datacenter and inserted into a seismic electronic equipment storage rack. After reading this description it will become apparent to one skilled in the art how to implement the invention in various alternative embodiments and alternative applications. However, although various embodiments of the present invention will be described herein, it is understood that these embodiments are presented by way of example only, and not limitation. As such, this detailed description of various alternative embodiments should not be construed to limit the scope or breadth of the present invention as set forth in the appended claims.

In accordance with some embodiments, a modular building block rack framework comprises vertical structural side members, which can be made by an extrusion process or other manufacturing process. The vertical structural side members can be cut to length to efficiently optimize the available vertical ceiling height of a given facility in which the system is to be installed. The vertical structural side members are implemented to withstand and transfer the vertical load of a plurality of direct-mounted or rack-rail-mounted electronic or non-electronic equipment appliance chassis in a very space-efficient manner. In some exemplary embodiments, the vertical structural side members also may contain a feature to receive self-tapping screws to enable direct coupling of electronic equipment chassis, thereby eliminating the need for rack rails. In some exemplary embodiments, the vertical structural side members are symmetrical, which results in only one part being required for all orientations in a given assembly. This symmetry in the vertical structural side members further enhances the manufacturing efficiency of the overall building-block framework of the system of the disclosure.

The modular building-block framework of the disclosure also comprises a plurality of horizontal structural members. The horizontal structural members may include predetermined symmetrical mounting patterns on the top and bottom planes of the horizontal structural members to enable efficient structural coupling when a plurality of building block frameworks are optionally stacked, as described below in detail, and for efficient structural anchoring at the base when required. The horizontal structural members may include predetermined symmetrical mounting patterns on the side planes of the horizontal structural members that enable the efficient coupling of the vertical structural side members, and for mounting a plurality of optional side-mounted fitments to the horizontal structural member, and to couple a plurality of modular building block frameworks together in a side-to-side manner.

The horizontal structural members may include predetermined symmetrical mounting patterns on the front and back planes of the horizontal structural members that enable for the efficient coupling of a plurality of optional fitments, such as, equipment chassis mounting rack rails, seismic anchoring brackets, and seismic bracing kits. In some exemplary embodiments, the seismic bracing kits can be efficiently added in an incremental manner to meet the equipment weight and seismic requirements of a given configuration weight, in a given geographic location. A plurality of optional equipment mounting rails, shelf systems, wire management systems, security doors and other features, which can be, for example, formed sheet metal and/or fixtures which can be formed by extrusion, molding or other process, can also be attached to the predetermined symmetrical mounting patterns to meet the individual requirements of any given implementation.

According to some exemplary embodiments, a building-block rack framework can optionally be shipped as individual components to an installation site and assembled onsite in an efficient manner. The vertical structural side members can optionally be precut to optimize the ceiling height of an installation. Also, or alternatively, the vertical structural side members can be cut to length onsite at the installation, and/or can be cut to order on a factory assembly line. The flexibility of the system of the disclosure increases site optimization and deployment configuration options while decreasing manufacturing costs. The building-block rack framework modules can also be pre-assembled and loaded with integrated electronic and non-electronic equipment at an optimal height and weight, facilitating global multimodal shipping of fully integrated equipment blocks that can then be stacked to a desired height at a given facility enabling greater manufacturing efficiency, shipping efficiency and implementation efficiency onsite. The resultant high-density building-block framework can be efficiently adapted to maximize the optimal height and density for a given installation facility. The framework can also be structurally adapted through the use of optional seismic bracing kits to meet the seismic requirements of an installation facility for a given geographic location. According to exemplary embodiments, the building-block framework module can be symmetrically configured to couple to other building-block framework modules side-to-side on the same plane, and optionally stacked and coupled in vertical columns with minimal mechanical effort.

FIG. 1 includes a schematic perspective view of a building-block rack framework assembly, in accordance with some embodiments. FIGS. 2A, 2B and 2C include a schematic perspective view, a schematic front view, and a schematic side view, respectively, of a building-block rack framework assembly, in accordance with some embodiments. Referring to FIGS. 1 and 2A-2C, building-block rack framework assembly 100 is part of a system for storing electronic and/or non-electronic equipment in a highly space-efficient, structurally integrated manner. As shown, four vertical structural side members 101 are coupled to a plurality of horizontal structural members 102 by a plurality of fasteners at coupling junctions 402 to form building block rack framework assembly 100. In some exemplary embodiments, vertical structural side members 101 can be formed by extrusion, thus increasing the efficiency and cost effectiveness of the manufacturing process. In some particular embodiments, vertical structural side members 101 can be extruded metal, such as extruded aluminum, or other similar material. In some alternative embodiments, vertical structural side members 101 can be formed by some other manufacturing process, such as stamping, molding or otherwise forming steel or carbon fiber or other similar material. Due to the symmetrical implementation of vertical structural side members 101, all vertical structural side members 101 utilize one common part in the present embodiment. Similarly, due to the symmetrical design of the horizontal structural members 102, all horizontal structural members utilize one common part in the present embodiment. Therefore, vertical structural side members 101 and horizontal structural members 102 are economical to manufacture, since they represent singular elements needed to implement all vertical structural side members, and all horizontal structural members, respectively.

FIGS. 3A, 3B and 3C include a schematic cross-sectional view and two schematic perspective views, respectively, of an exemplary extruded vertical structural side member 101 illustrated in FIGS. 1, 2A, 2B, and 2C, according to some embodiments. Continuing to refer to FIGS. 1 and 2A-2C, in some exemplary embodiments, vertical structural side members 101 have a length which is selectable according to the desired height of assembly 100 in the facility in which assembly 100 is installed. For example, in some embodiments, vertical structural side members 101 can be cut to length to optimize the available vertical ceiling height of a given facility. Vertical structural side members 101 are designed to withstand and transfer the vertical load of a plurality of rail or shelf mounted electronic or non-electronic equipment modules. As illustrated in the cross-sectional view of FIG. 3A, vertical structural side member 101 may include a self-tapping screw receiver channel 305 formed in the front and rear leading edges vertical structural side member 101 to enable optional direct attachment of computer chassis equipment and other optional fitments with the use of self-tapping screws. A plurality of module coupling holes 310 and 320 on vertical structural side member 101 may be used to align and couple vertical structural side member 101 to horizontal structural member 102 to form modular building block framework assembly 100.

Figure 2D:
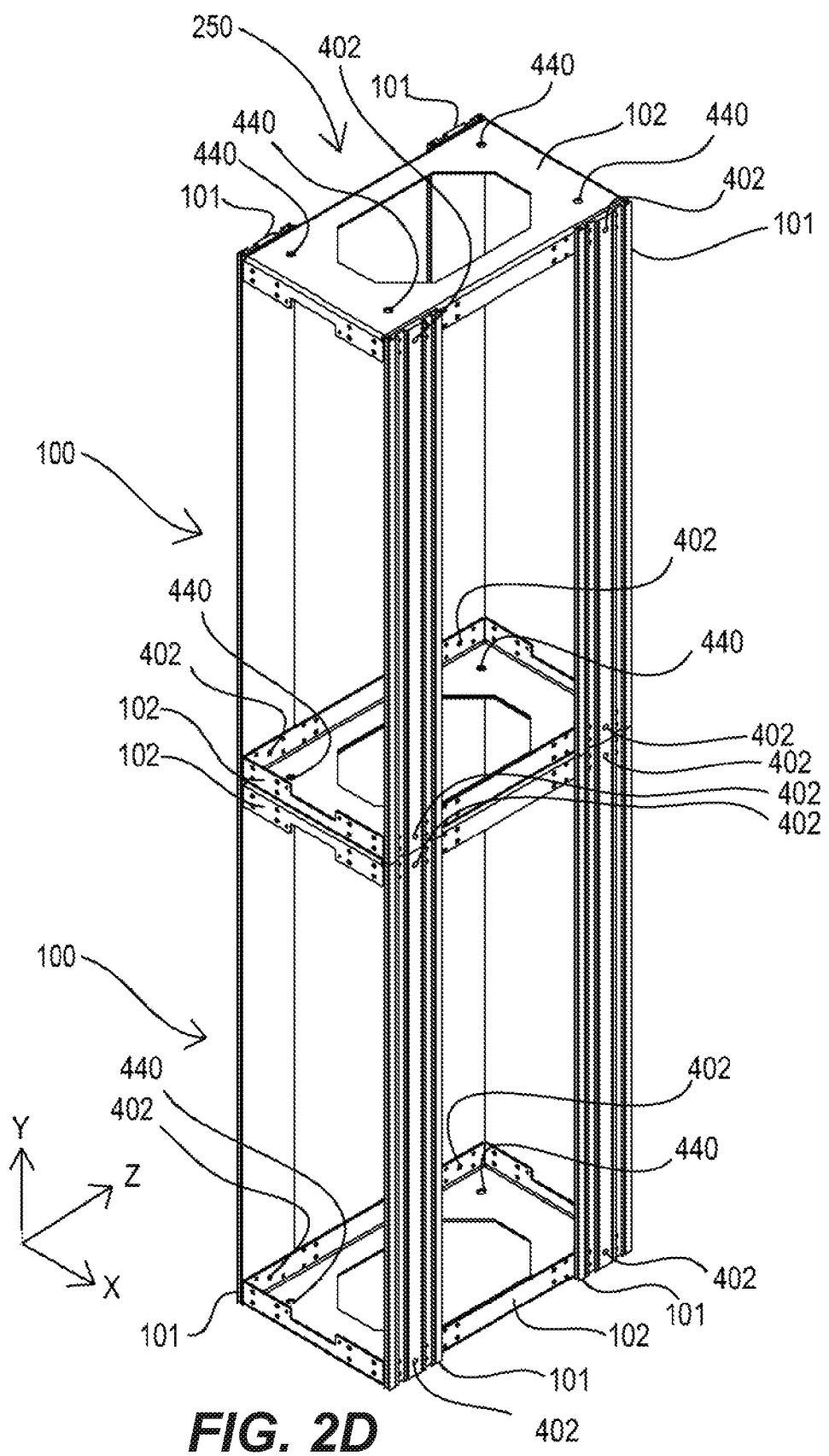
FIG. 2D includes a schematic perspective view of two building-block rack framework assemblies stacked and coupled into a vertical column, in accordance with some embodiments.

In general, the present disclosure is applicable to a building-block framework assembly 100 having any selected height, width, and depth. However, in some particular exemplary embodiments as illustrated in FIGS. 2A, 2B and 2C, the height Y of each building-block rack framework module 100 is 1.5-meters, providing 30 U of equipment storage that can be stacked and coupled to another 1.5-meter 30 U assembly 100, as illustrated in FIG. 2D, for a system 250 having a total vertical height of 3.0 meters and 60 U of equipment storage in each vertical column, with a width X of 480 mm to 500 mm in the present embodiment to accommodate legacy 17.75" equipment chassis, and a depth Z of 800 to 1220 mm. According to some exemplary embodiments, adjustments can be made in, for example, the width X and depth Z of horizontal structural member 102 to facilitate equipment designed for 23" equipment chassis, or to attain any other equipment width or depth if mounting legacy equipment chassis is not required.

Figure 4A:
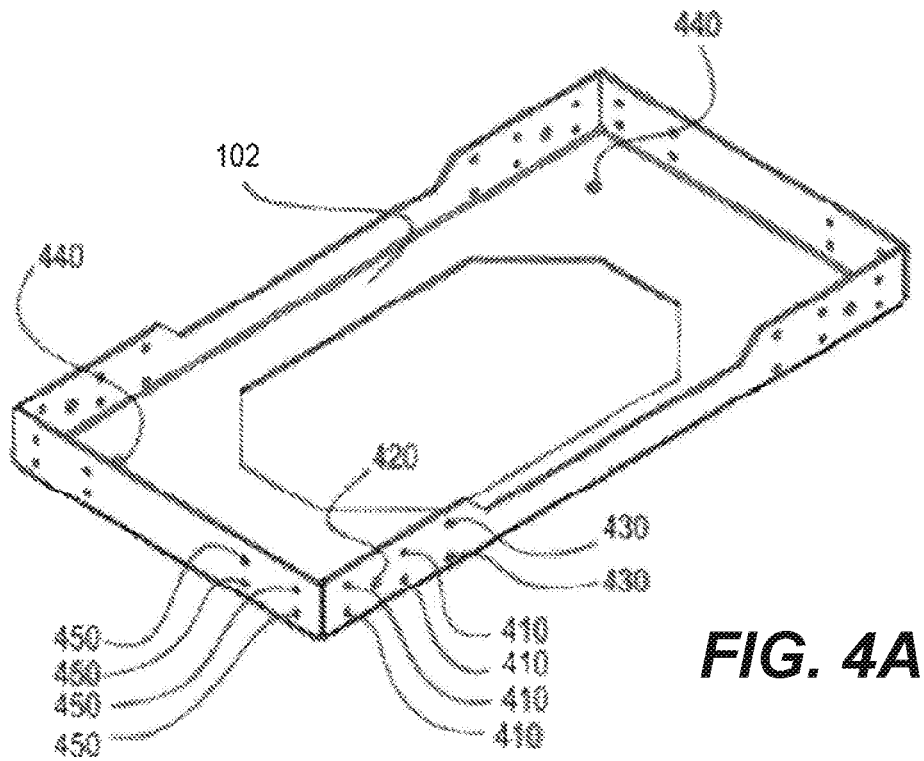
FIG. 4A includes a schematic perspective view of a horizontal structural member of a rack framework assembly, in accordance with some embodiments.
Figure 4B:
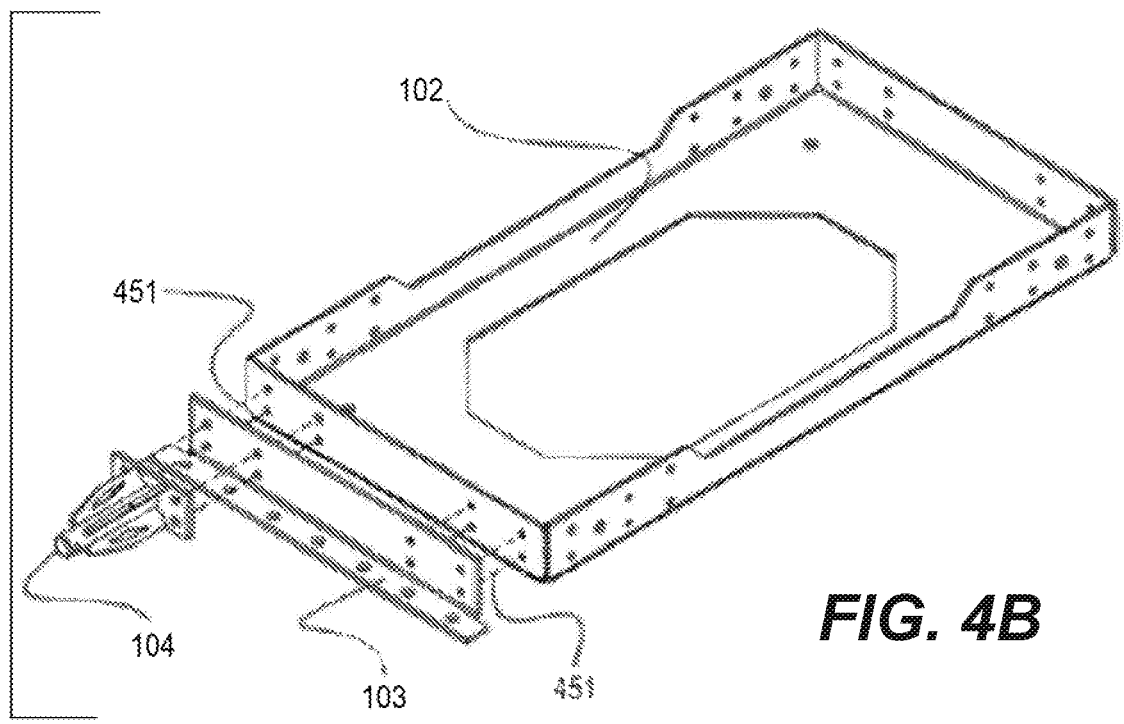
FIG. 4B includes a schematic perspective exploded view of a horizontal structural member of a rack framework assembly with optional fitments, in accordance with some embodiments.

FIG. 4A includes a schematic perspective view of a horizontal structural member of a rack framework assembly, in accordance with some embodiments. FIG. 4B includes a schematic perspective exploded view of a horizontal structural member of a rack framework assembly with optional fitments, in accordance with some embodiments.

Referring to FIGS. 2A, 4A and 4B, horizontal structural members 102 may include predetermined symmetrical mounting features 440 on the top and bottom plane of building-block framework assembly 100 to enable efficient structural coupling when a plurality of building block framework assemblies 100 are optionally stacked, or for efficient structural anchoring at the bottom or base of assembly 100 when required. A plurality of module coupling holes 410 located in symmetrical patterns on the side planes of horizontal structural member 102 may be used to align and couple vertical structural side member 101 to horizontal structural member 102 to form modular building block framework assembly 100. A plurality of side accessory coupling holes 430 located in symmetrical patterns on the side planes of horizontal structural member 102 may be used to efficiently attach optional fitments, such as, for example, shelf rail kits. A plurality of front and back structural accessory coupling holes 450 located in symmetrical patterns on the front and back planes of horizontal structural member 102 may be used to efficiently attach optional structural fitments, such as, for example, seismic anchor plate 103 and seismic adapter kit bracket 104. A plurality of other optional fitments, such as, for example, equipment mounting rails, wire management systems, security doors, power distribution and other formed sheet metal, extruded, molded or otherwise-formed fixtures can also be attached to the predetermined symmetrical mounting patterns 451 to meet the individual requirements of any given implementation. A plurality of module coupling holes 420 located in symmetrical patterns on the side planes of horizontal structural member 102 may be used to enable efficient coupling of a plurality of building block framework assemblies 100 in a side-to-side manner to form the structurally integrated framework system.

FIG. 2D includes a schematic perspective view of two building-block rack framework assemblies 100 stacked and coupled into a vertical column system 250, in accordance with some exemplary embodiments. Referring to FIGS. 2A-2D, individual building-block rack framework assemblies 100 can be stacked to increase equipment manufacturing efficiency, facilitate international multimodal shipping and accelerate onsite deployment, thus lowering cost throughout the entire supply chain. By utilizing predetermined symmetrical mounting features 440 to vertically align and couple building-block rack framework assembly 100 at the predetermined symmetrical mounting features 440, the vertically coupled building-block rack framework assemblies 100 become one structurally integrated rack framework column 250.

Figure 5A:
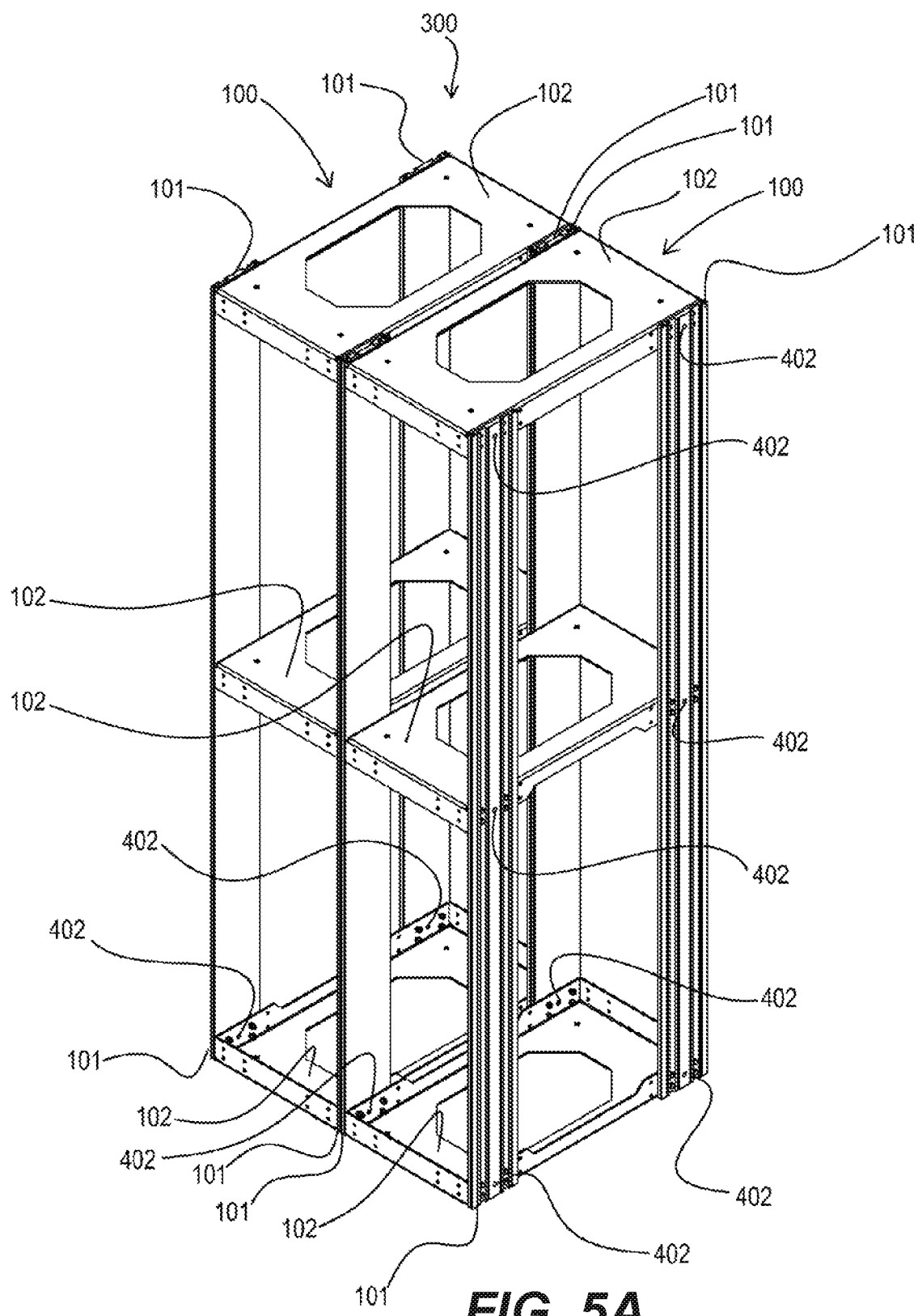
FIGS. 5A, 5B and 5C include schematic perspective views of a plurality of coupled building block rack framework assemblies, in accordance with some embodiments.

FIG. 5A includes a schematic perspective view of a plurality of building-block rack framework assemblies 100 coupled into a rack framework system 300, in accordance with some embodiments. Referring to FIGS. 1, 2A-2C, 3A-3C, 4A, 4B and 5A, horizontal structural members 102 transfer dynamic loads from vertical structural side members 101 through the interlocking framework of coupled building-block rack framework assemblies 100. The interlocking framework of coupled building-block rack framework assemblies 100 illustrated in FIG. 5A is created by coupling a plurality of modular building-block framework assemblies 100 together at the coupling junctions 402 of each horizontal structural member 102. According to the exemplary embodiments, the binding of the common vertical structural side members 101 through the interlocking horizontal structural members 102 allows for space-efficient narrow vertical structural side members 101 that recapture much of the space lost in the width of traditional box-frame rack cabinet architectures without compromising dynamic seismic load capabilities. According to the embodiments, the efficient narrow structural vertical side member 101, structurally reinforced by the coupling junctions 402 of the horizontal structural members 102, allows for modular building-block rack framework assemblies 100 as narrow as 480-500 mm that hold standard 450 mm rack-mountable chassis equipment. This represents a density increase of over 20% when compared to standard 24-inch-wide equipment racks. Additional density increases of 2-30% can be achieved by extending the length of vertical structural side members 101 to better optimize vertical free space in a datacenter. According to the exemplary embodiments, these two aspects of the present disclosure used together can attain density increases in excess of 20-50% in the average datacenter over standard 42 U, 24-inch-wide equipment racks.

Figure 5B:
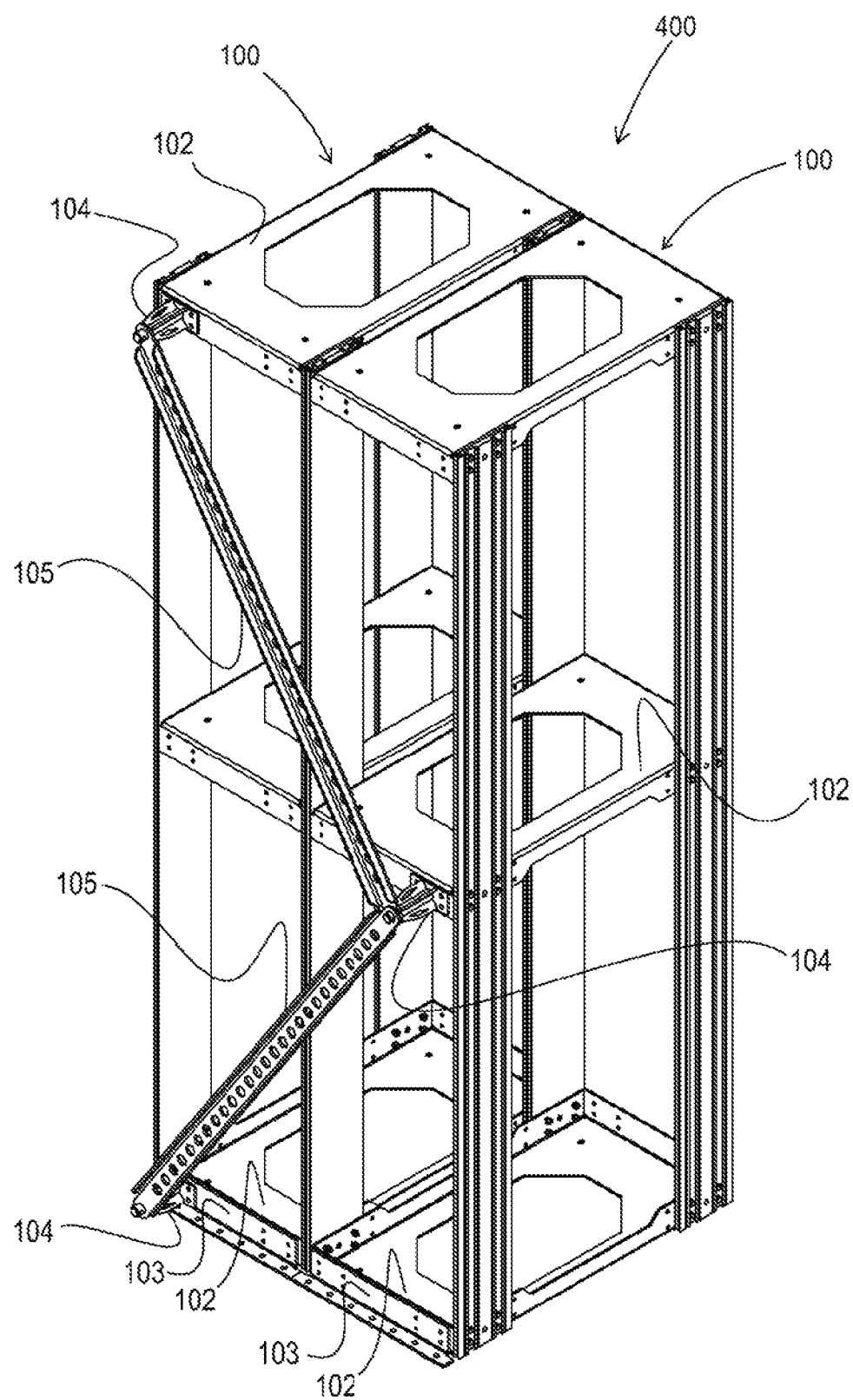
Figure 5C:
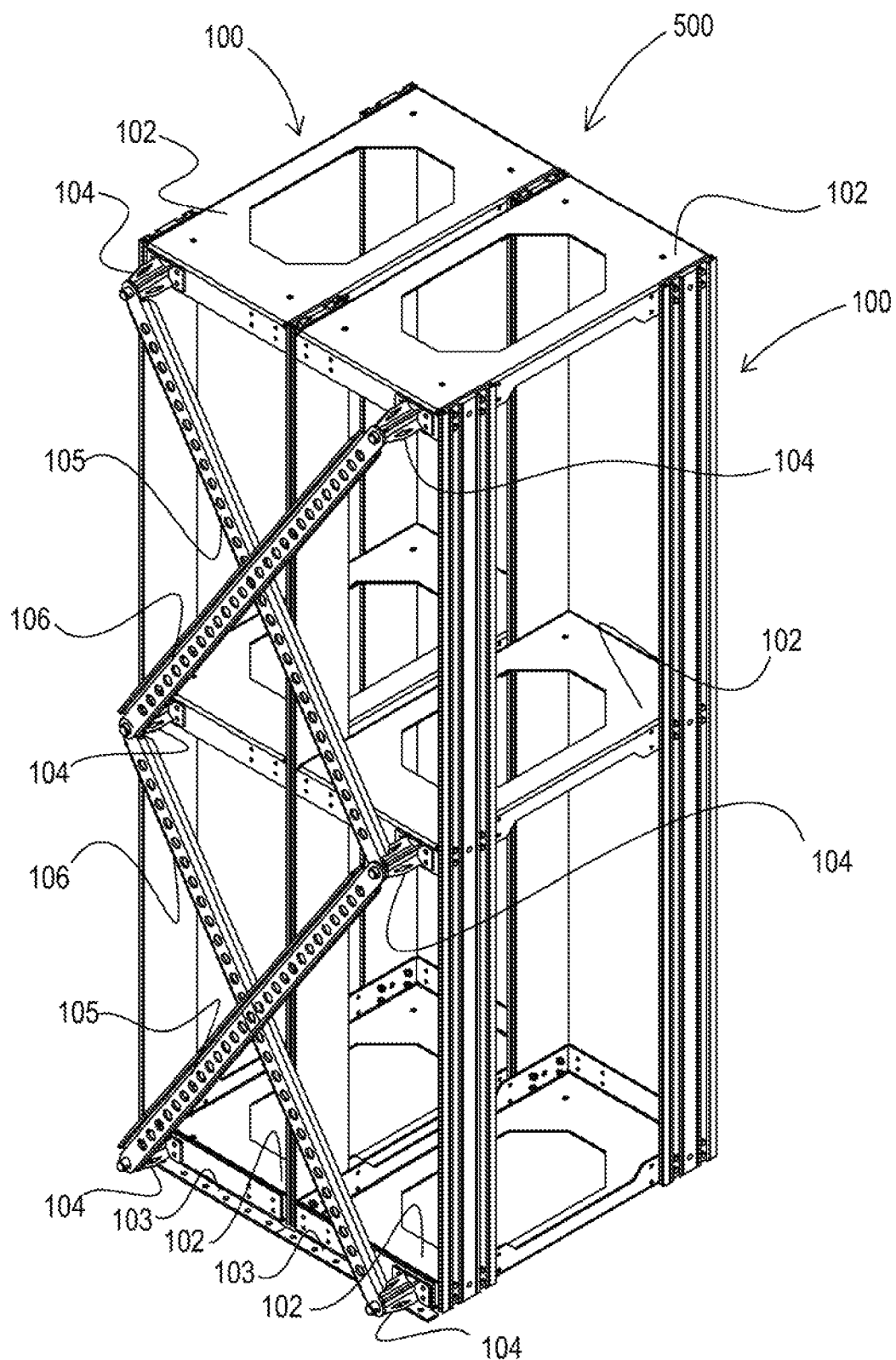

FIGS. 5B and 5C include additional schematic perspective views of building-block rack framework assemblies 100 coupled into rack framework systems 400 and 500, respectively, with exemplary seismic adapter kits installed. The seismic structural elements of building block framework systems 400 and 500 can be divided into at least two structurally complementary feature sets. As illustrated in FIGS. 2A-2C, for example, vertical structural side members 101, having a thin planar design, when coupled to horizontal structural side members 102, make the building-block rack framework 100 rigid on the Y and Z axes, while maintaining an exceptionally narrow footprint for the building-block rack framework assembly 100 on the X axis. Seismic bracing kits illustrated in FIGS. 5B and 5C can then be optionally mounted in a plurality of incremental orientations on the front and rear surfaces of horizontal structural side members 102, thereby stiffening building-block rack framework assembly 100 on the X and Y axes in a highly space efficient manner, external to the electronic and non-electronic equipment mass.

FIGS. 5B and 5C illustrate seismic adapter brackets 104 coupled to horizontal structural side member 102. Two seismic adapter braces 105 can be coupled to seismic adapter brackets 104 to meet the dynamic load requirements for a specific application and seismic region. FIG. 5C illustrates an example of two seismic adapter kits with the addition of three seismic adapter brackets 104 coupled to horizontal structural members 102, with two additional seismic adapter braces 106 coupled to the additional set of seismic adapter brackets 104 to meet incrementally greater dynamic load requirements and possible more stringent seismic requirements for a geographic region with higher seismic activity.

Figure 6:
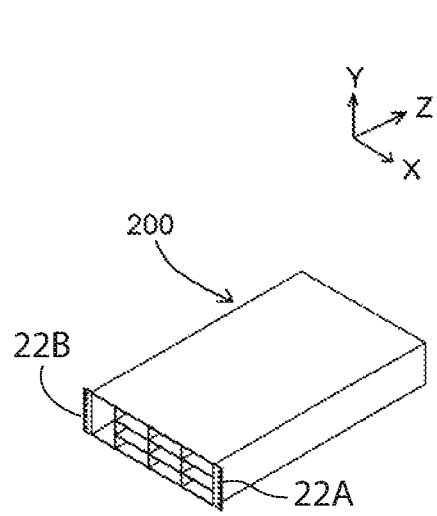
FIG. 6 includes a schematic perspective view of an exemplary 3 U rack-mountable computer chassis to which the system of the disclosure is applicable, in accordance with some embodiments.

FIG. 6 includes a schematic perspective view of an exemplary 3 U rack-mountable computer chassis to which the system of the disclosure is applicable, in accordance with some embodiments. Referring to FIG. 6, an exemplary 3 U rack-mountable computer chassis 200 includes a first chassis flange 22A and a second chassis flange 22B, and would conventionally be installed and integrated into a legacy 24" computer rack after the computer rack was installed at the installation location. This is typically referred to as "rack and stack" in the data center industry. One disadvantage to such an approach is that the onsite integration is labor intensive and requires a plurality of specialized skillsets to be performed onsite at an elevated cost to the end customer.

Figure 7A:
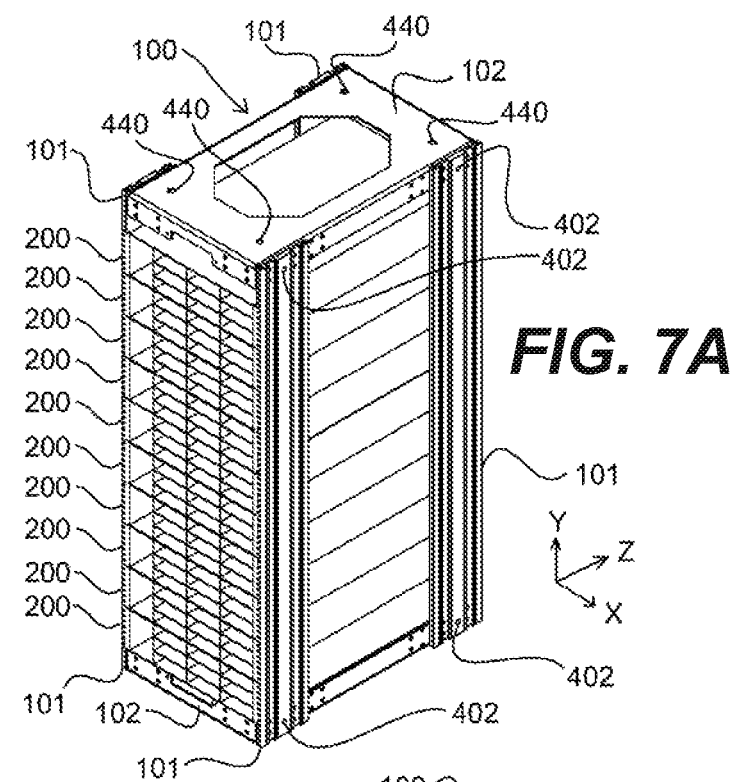
FIGS. 7A, 7B and 7C include a schematic perspective view, a schematic front view, and a schematic side view, respectively, of a building-block rack framework assembly populated with a plurality of 3 U exemplary rack-mountable computer chassis, in accordance with some embodiments.
Figure 7B:
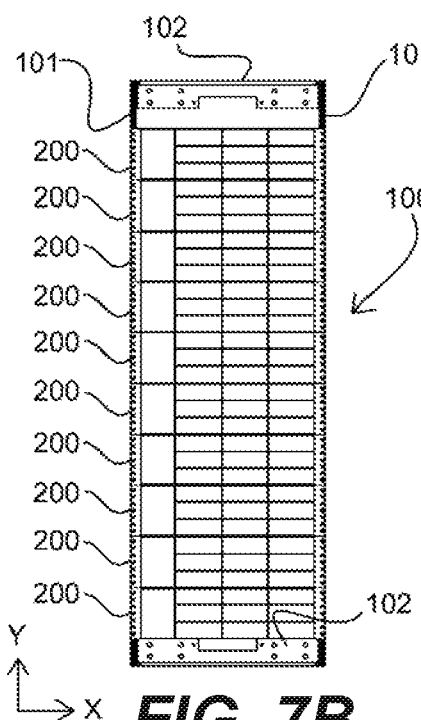
Figure 7C:
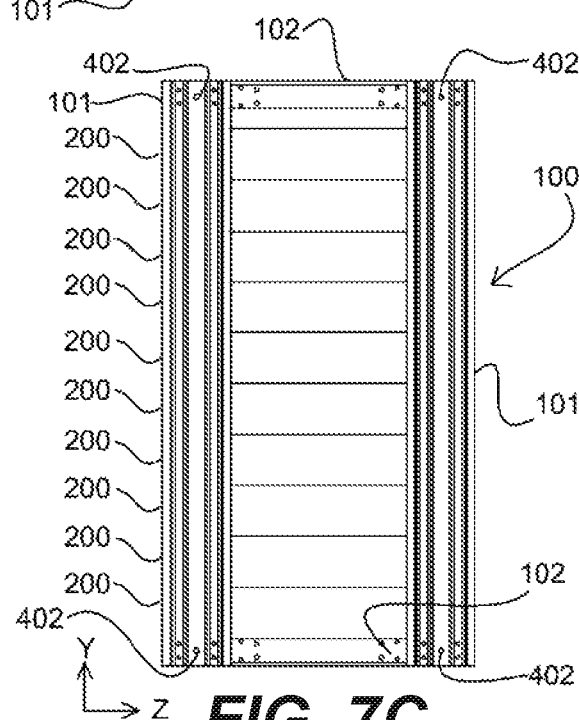
Figure 8:
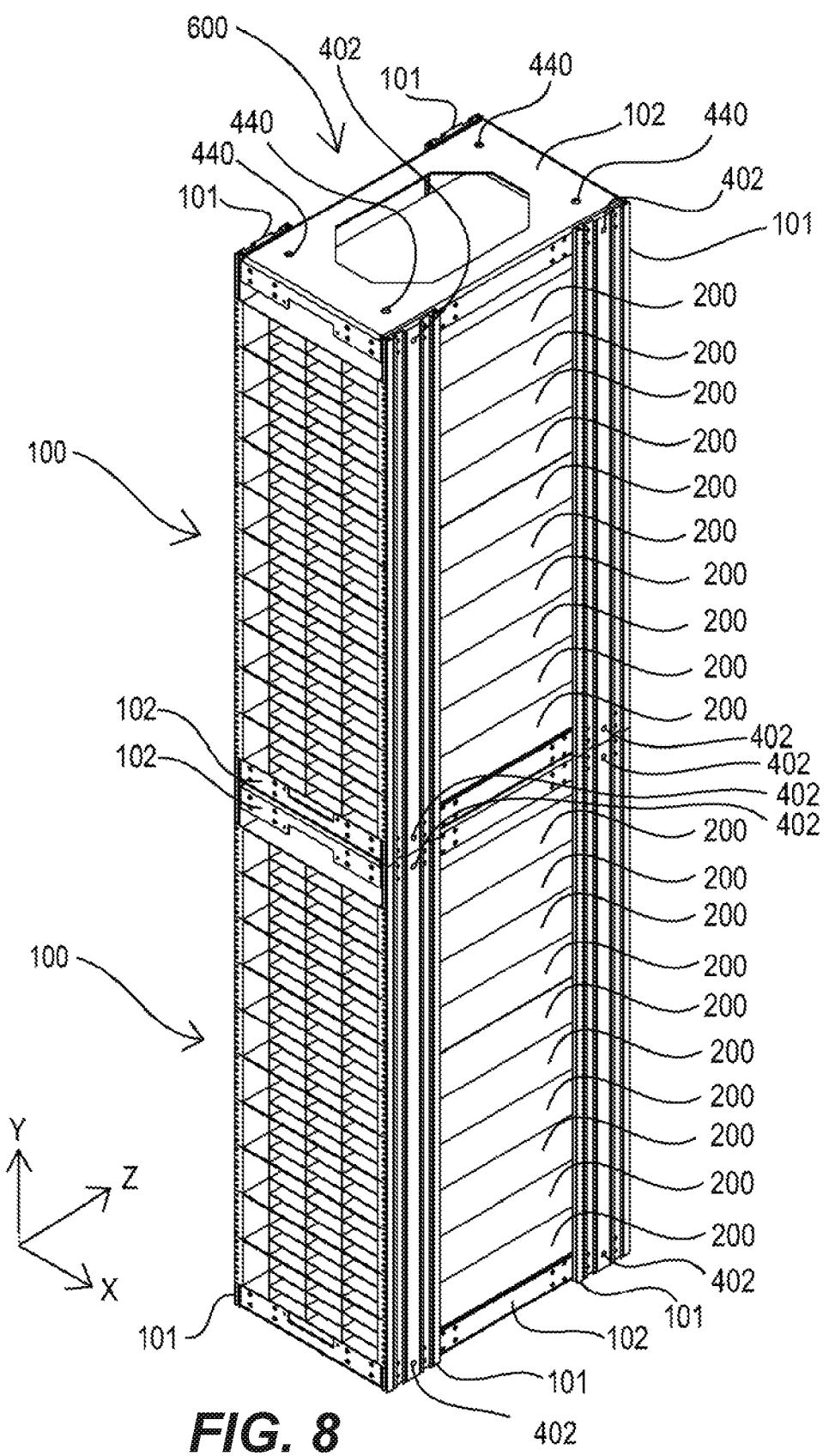
FIG. 8 includes a schematic perspective view of two building-block rack framework assemblies stacked and coupled in a vertical column populated with a plurality of exemplary 3 U rack mountable computer chassis, in accordance with some embodiments.

FIGS. 7A, 7B and 7C include a schematic perspective view, a schematic front view, and a schematic side view, respectively, of a building-block rack framework assembly 100 populated with a plurality of exemplary 3 U rack-mountable computer chassis 200, in accordance with some embodiments. FIG. 8 includes a schematic perspective view of two building-block rack framework assemblies 100 populated with a plurality of exemplary 3 U rack-mountable computer chassis 200, and stacked and coupled into vertical building-block rack framework column 600.

Referring to FIGS. 7A-C and 8, integration of a plurality of equipment chassis, such as the exemplary 3 U rack-mountable computer chassis 200 illustrated in FIG. 6, could optionally be performed onsite, or alternately in advance of delivery on a factory floor by the manufacturer, and then shipped to the installation location as a fully integrated unit. The advantage to the latter approach is that installation, integration and even pre-configuration services can all be performed prior to delivery at a much lower cost, then more cost effectively shipped to the final location in a much more modal shipping unit than a traditional 42 U 24" rack. Then, the integrated building-block rack framework assemblies 100 can be optionally anchored, stacked and coupled to an optimal-height building-block rack framework column 600. This optional solution not only lowers the integration cost and facilitates shipping, it also enables maximum utilization of vertical space in the facility, e.g., datacenter. FIGS. 7A-C and 8 show computer chassis 200 inserted into building-block rack framework assemblies 100 with flanges 23A and 23B seated against side members 101. In some exemplary embodiments, a plurality of building-block rack framework column 600 can then be coupled side-to-side into structurally integrated, seismically reinforced rows as illustrated in FIGS. 5A-5C.

Due to the symmetrical design of the building-block rack framework assembly 100, such seismic adapter kits can be added to the front of the unit, back of the unit, or both. This creates a highly efficient seismic bracing approach that can be incrementally added to equipment rack framework assemblies 100 in a cost effective manner, without increasing the spatial mass of the building block framework on the Z and Y axis. This enables equipment density increases in excess of 25-50%, while increasing dynamic load capacities 100-200% over standard 42 U, 24" (609.6 mm) wide equipment racks.

In some exemplary embodiments, building-block rack framework assembly 100 of the disclosure can be optionally preassembled and shipped to an installation location. Alternatively, individual components of building-block rack framework assembly 100 can be shipped to an assembly location or to an installation location, and then assembled at the assembly location or installation location. Side members can be optionally precut in advance to optimize the ceiling height of an installation, or can be cut to length on location. A plurality of optional fitments including equipment mounting rails, shelf systems, wire management systems, security doors and other sheet metal, extruded or molded fixtures can also be attached to meet the special requirements of any given implementation.

According to some embodiments, a structurally integrated modular shelf frame equipment storage system can be built according to a user's specific needs that best utilize the capability of given facility. The systems, modules and methods described herein provide an efficient approach to storing equipment and reducing infrastructure cost. The flexibility and scalability of the structurally integrated modular shelf frame systems, modules and methods described herein satisfy those needs, as well as others.

For instance, in some embodiments, because the structurally integrated system is modular, building-block framework assemblies can be fully pre-populated with equipment and wire management, and then shipped to a given location. There they can be modularly stacked and coupled without the need for existing equipment rack infrastructure, or optionally mounted into existing equipment racks. Additionally, this modularity aids in the task of physically relocating equipment by eliminating the need to remove individual components.

Figure 9:
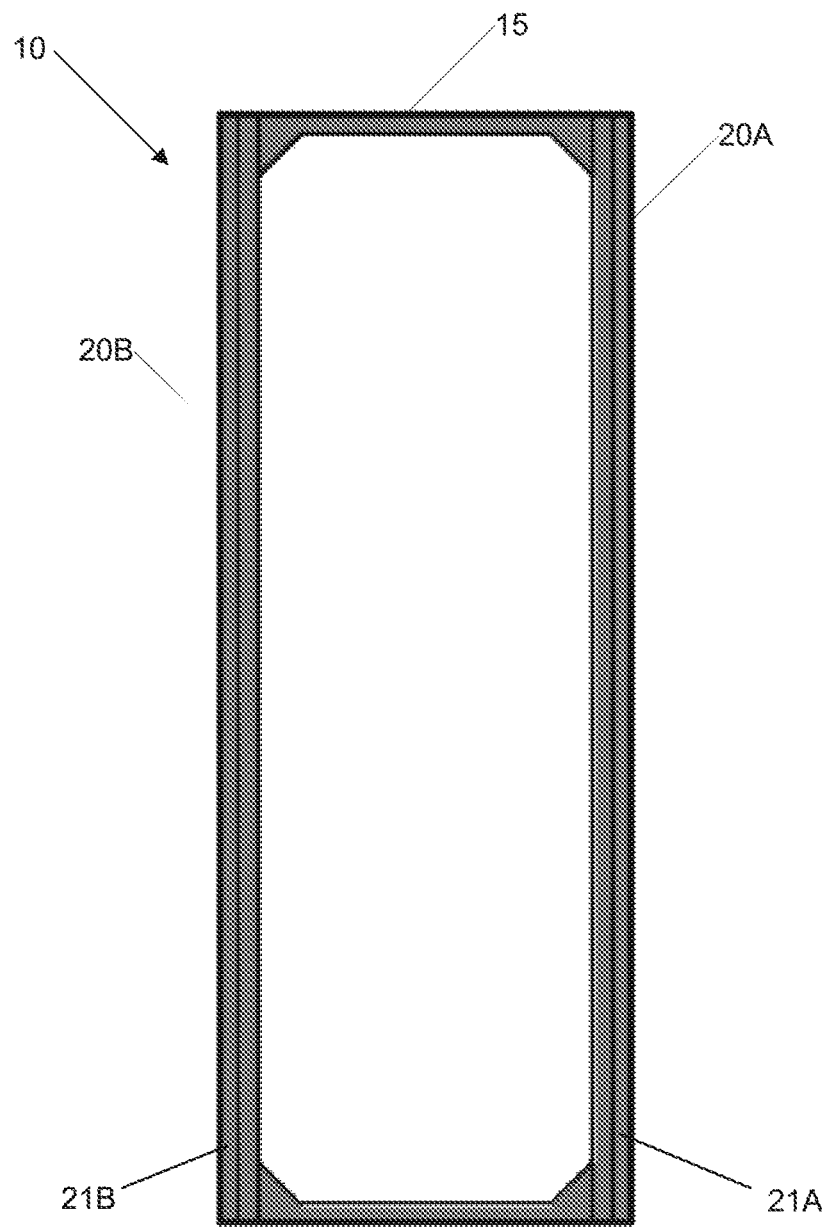
FIG. 9 is a front view diagram illustrating an example integration cell according to an embodiment of the invention.

FIG. 9 is a front view diagram illustrating an example integration cell 10 according to an embodiment of the invention. As described subsequently, integration cell 10 is adapted to receive electronic equipment chassis 200 and to be placed within building-block rack framework assembly 100. In the illustrated embodiment, the integration cell 10 comprises a housing 15 that includes a stopper flange 20A and 20B, wherein the stopper flange 20A and 20B contains a front planar surface referred to herein as an electronic equipment chassis mounting flange 21A and 21B. Each stopper flange 20A and 20B is positioned on the front of the integration cell 10.

The housing 15 has a plurality of functions. A first function may be to provide a structure within which one or more electronic or non-electronic equipment chassis can be inserted and secured to the electronic equipment chassis mounting flange 21A and 21B. An electronic or non-electronic equipment chassis can be secured to the electronic equipment chassis mounting flange 21A and 21B by one or more methods, including, but not limited to, mechanical and/or magnetic fasteners. A second function is to facilitate installation into a seismic electronic equipment storage rack. A third function may be to facilitate modality and to protect the contents of the one or more electronic equipment chassis during land, sea, or air transportation from the location where the integration cell 10 is pre-installed with the one or more electronic equipment chassis to the datacenter location.

Advantages of the integration cell 10 is that it allows remote installation and configuration (e.g., wiring) of plural electronic equipment by the provider of the electronic equipment and it allows bulk insertion and removal of plural pre-configured electronic equipment in a datacenter further lowering the cost and time required for onsite deployment of electronic and non-electronic equipment. Additionally, a plurality of optional fitments including, but not limited to, equipment mounting rails, shelf systems, wire management systems, cooling units, security doors and other sheet metal, extruded or molded fixtures can also be attached or otherwise coupled to meet the special requirements of any given implementation.

The electronic equipment chassis mounting flange 21A and 21B provides a surface to engage a corresponding surface of an electronic equipment chassis when the electronic equipment chassis is installed in the integration cell 10 and allows the electronic equipment chassis to be secured to the integration cell 10.

The stopper flanges 20A and 20B function to provide surfaces to align, engage and secure a corresponding surface on an electronic equipment storage rack when the integration cell 10 is inserted into the electronic equipment storage rack as described subsequently.

Figure 10:
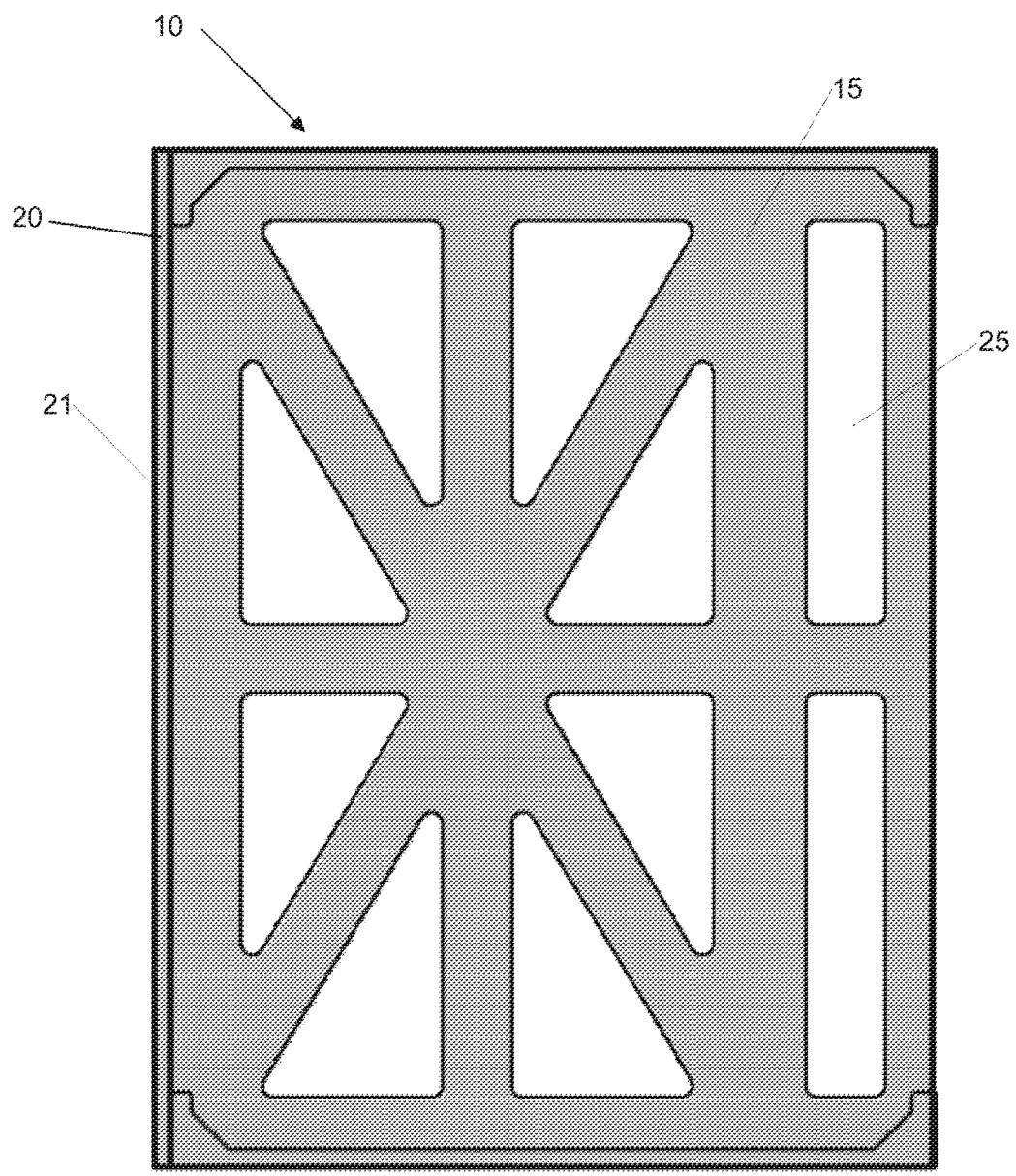
FIG. 10 is a side view diagram illustrating an example integration cell according to an embodiment of the invention.

FIG. 10 is a side view diagram illustrating an example integration cell 10 according to an embodiment of the invention. In the illustrated embodiment, the integration cell 10 comprises a housing 15 and stopper flange 20, having an electronic equipment chassis mounting flange 21. In the illustrated embodiment, the housing 15 optionally has one or more cutouts 25 in the side wall. The cutouts 25 provide weight reduction of the integration cell 10 without compromising the structural integrity of the integration cell 10 or its ability to protect the contents of the one or more electronic equipment chassis that are installed in the integration cell 10. Additionally, the optional cutouts 25 provide for ventilation and cooling of the electronic equipment during operation in the datacenter.

Figure 11:
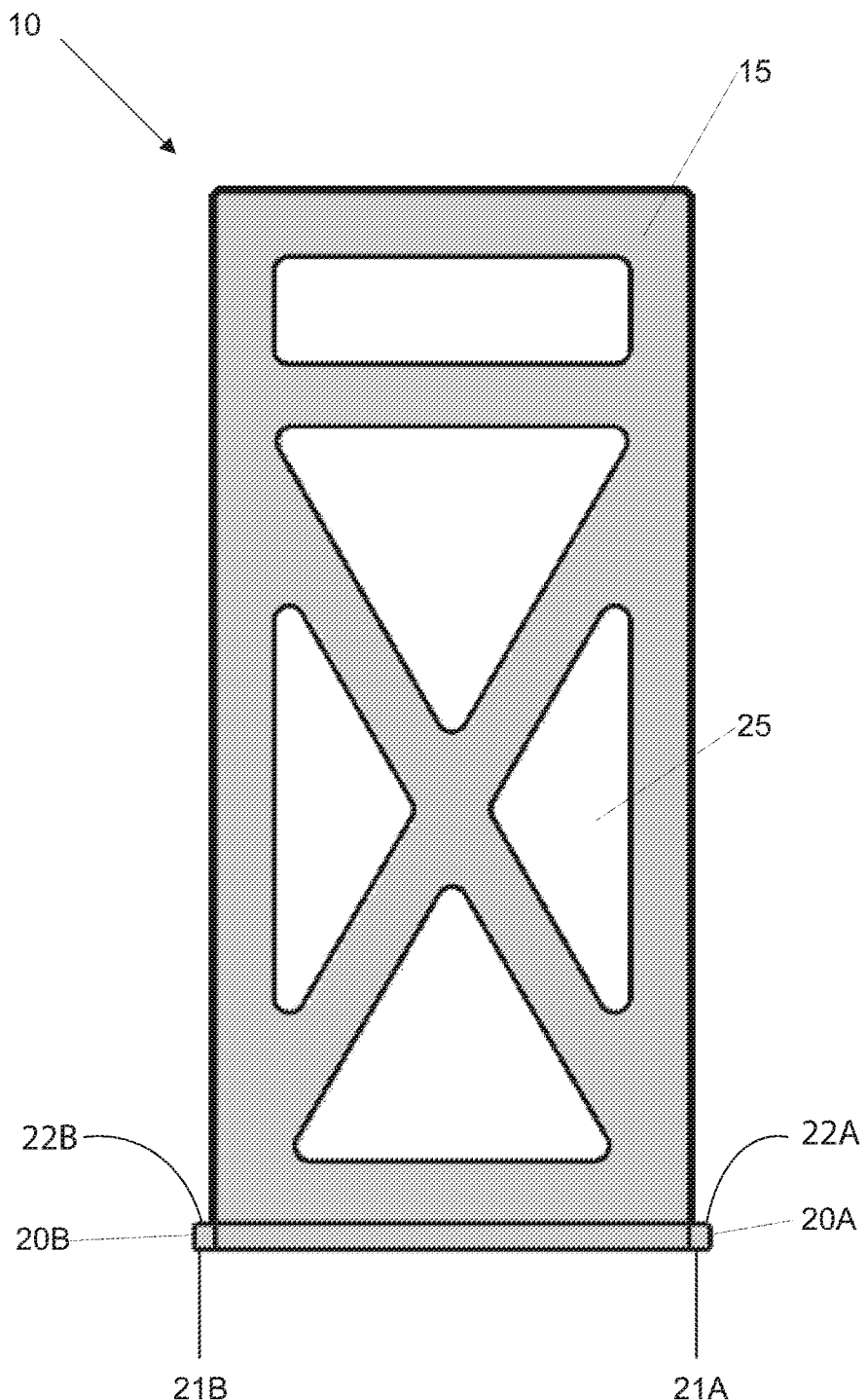
FIG. 11 is a top view diagram illustrating an example integration cell according to an embodiment of the invention.

FIG. 11 is a top view diagram illustrating an example integration cell 10 according to an embodiment of the invention. In the illustrated embodiment, the integration cell 10 comprises stopper flanges 20A and 20B, having an electronic equipment chassis mounting front flange faces 21A and 21B, and mounting rear flange faces 22A and 22B, and one or more optional cutouts 25 in the top wall or the integration cell 10.

Figure 12:
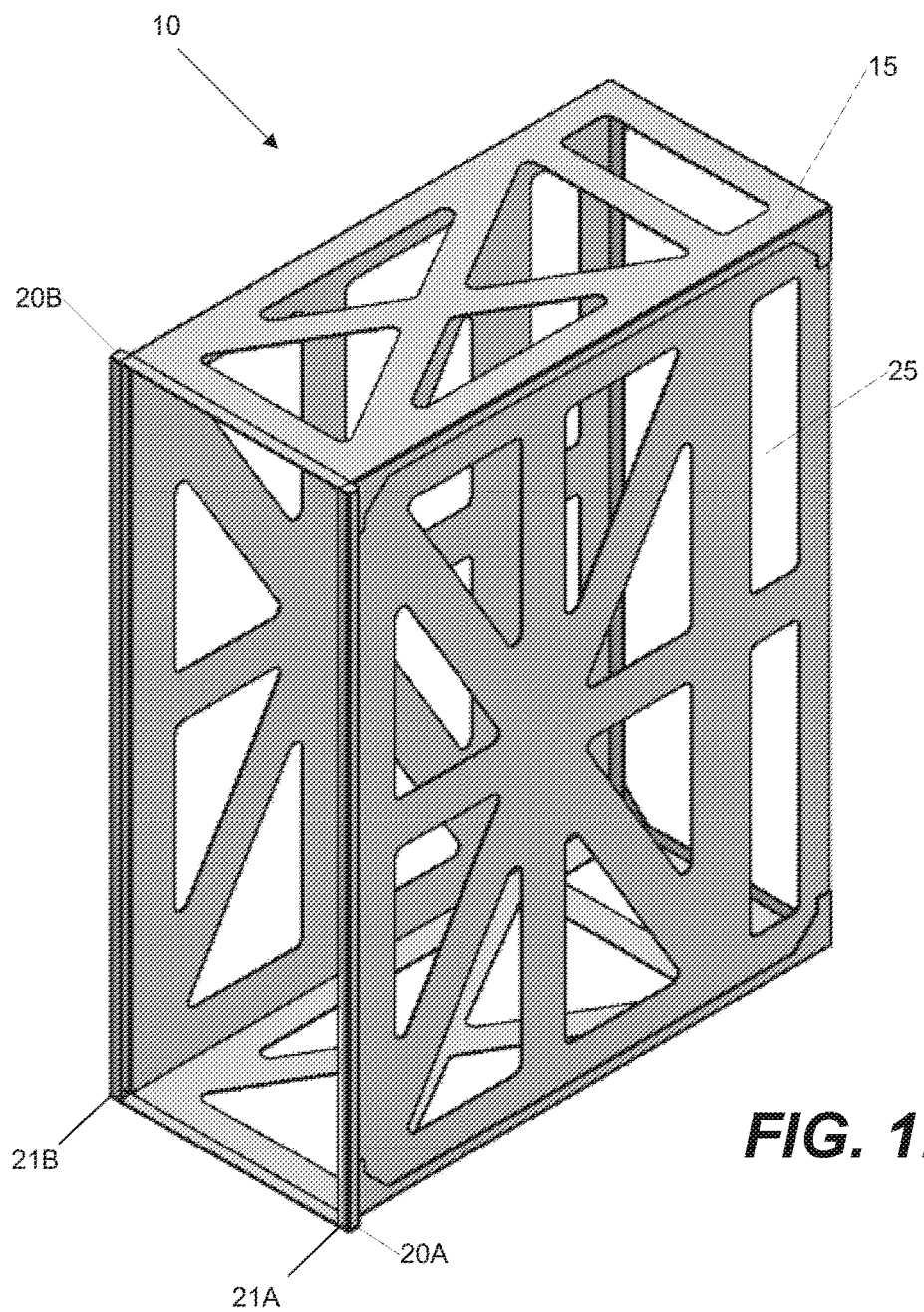
FIG. 12 is a perspective view diagram illustrating an example integration cell according to an embodiment of the invention.

FIG. 12 is a perspective view diagram illustrating an example integration cell 10 according to an embodiment of the invention. In the illustrated embodiment, the integration cell 10 comprises stopper flanges 20A and 20B, having electronic equipment chassis mounting flange faces 21A and 21B and one or more optional cutouts 25 in each wall of the housing 15. The housing 15 includes a top wall, a bottom wall, a first side wall and a second side wall. As illustrated, each of the walls includes one or more cutouts 25 to provide weight reduction and cooling ventilation while retaining the structural integrity of the integration cell.

Figure 13:
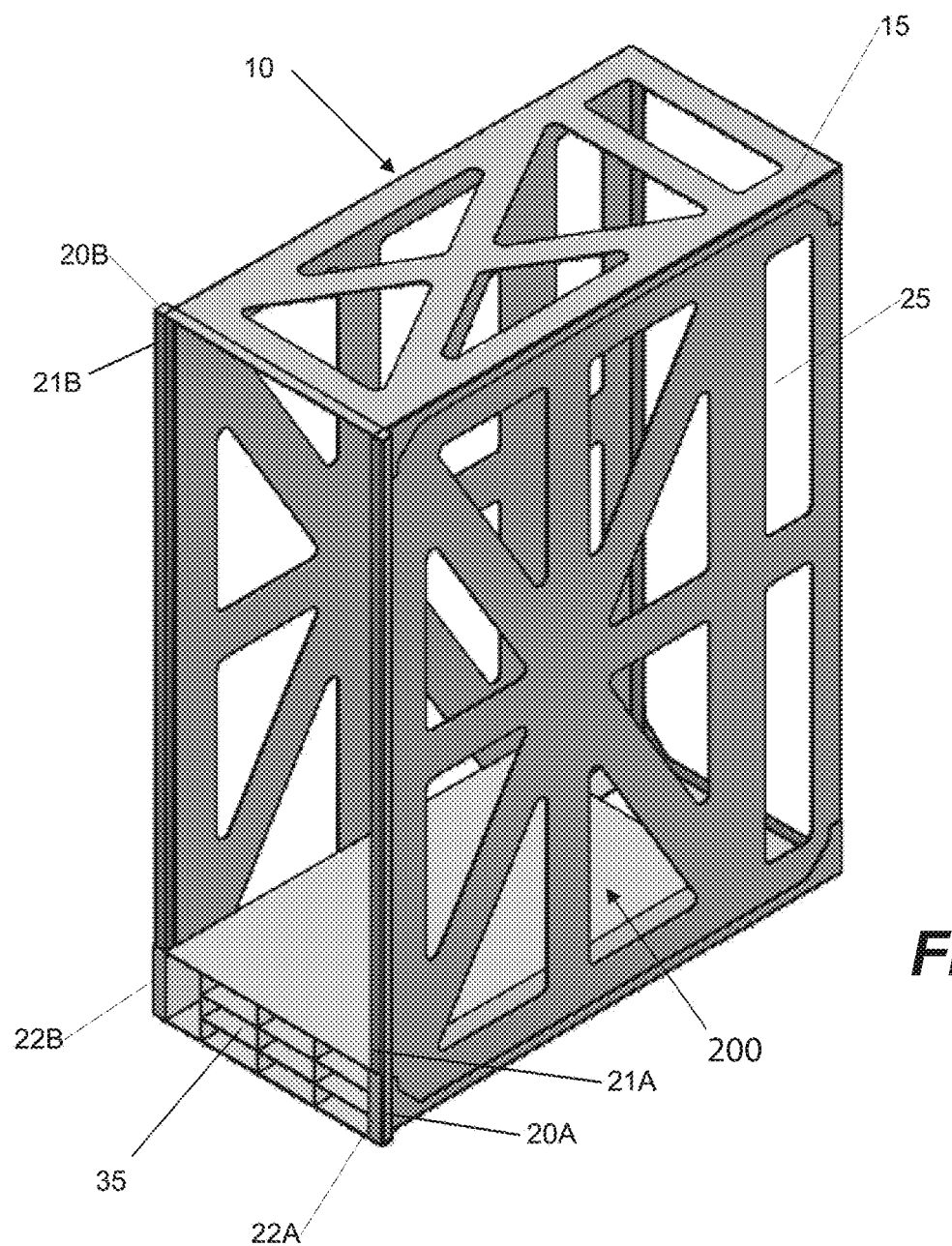
FIG. 13 is a perspective view diagram illustrating an example integration cell with an electronic equipment chassis according to an embodiment of the invention.

FIG. 13 is a perspective view diagram illustrating an example integration cell 10 with an electronic equipment chassis 200 according to an embodiment of the invention. In the illustrated embodiment, the electronic equipment chassis 200 comprises first chassis flange 22A and second chassis flange 22B. Each chassis flange 22A and 22B comprises a surface designed to engage and couple to a respective surface of the electronic equipment chassis mounting flanges 21A and 21B. Accordingly, the electronic equipment chassis 200 can be pre-installed with electronic equipment and pre-wired and then inserted into the housing 15 of the integration cell 10 and secured. The housing 15 of the integration cell 10 includes one more optional cutouts 25 for weight reduction and ventilation.

In the illustrated embodiment, the electronic equipment chassis 200 comprises one or more electronic equipment bays 35. Each of the one or more electronic equipment bays 35 is configured to house one or more electronic equipment (not shown).

Figure 14:
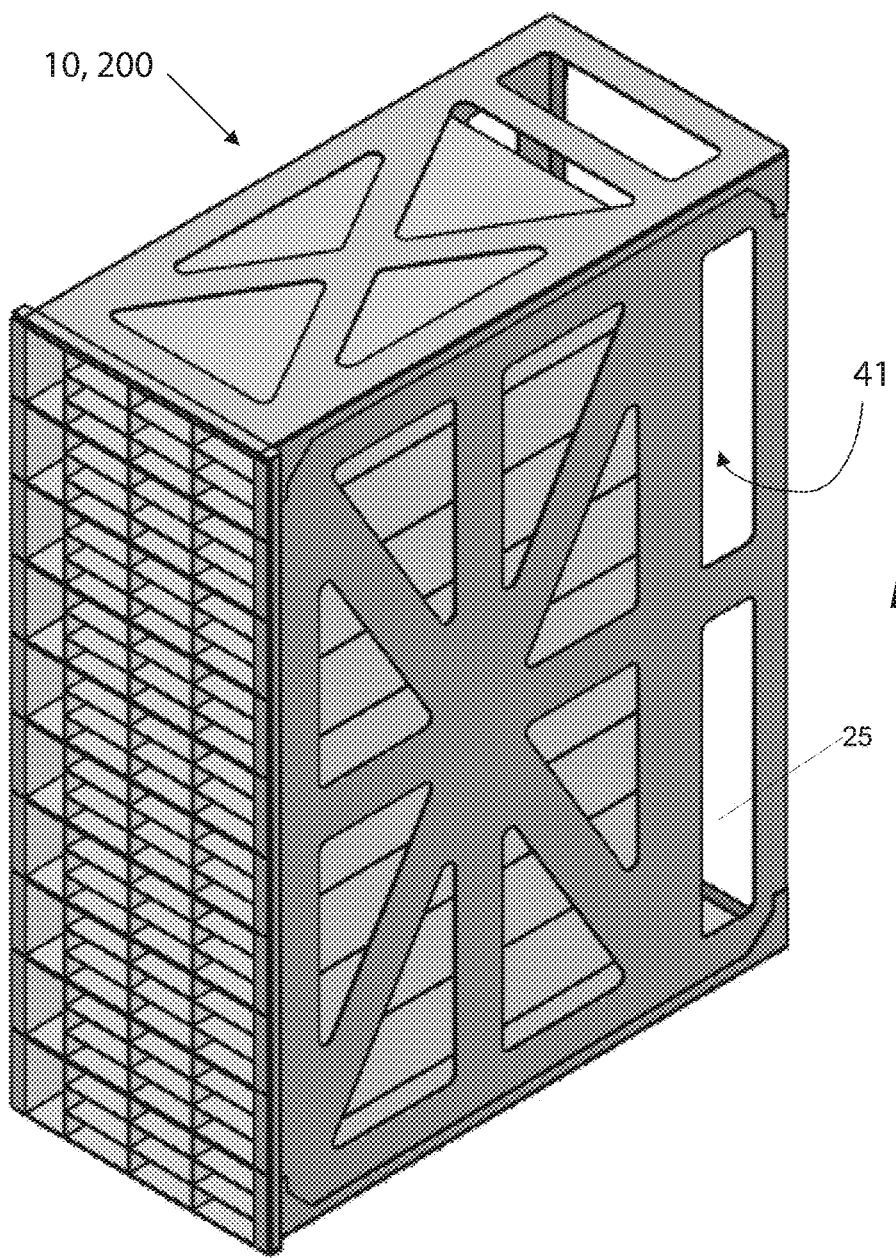
FIG. 14 is a perspective view diagram illustrating an example integration cell with plural electronic equipment chassis according to an embodiment of the invention.

FIG. 14 is a perspective view diagram illustrating an example integration cell 10 with plural electronic equipment chassis 200 according to an embodiment of the invention. Additionally, one or more optional cutouts 25 are positioned in the back end portion of the housing 15 that is not adjacent to a surface of the plural electronic equipment chassis 200. Advantageously, the open space 41 at the back end of the housing 15 allows for cooling ventilation and air circulation and also defines an area within the housing 15 to accommodate installation of close coupled cooling equipment and/or power distribution equipment, which may be fastened to the integration cell 10 or to the electronic equipment storage rack in the datacenter. In one embodiment, the cooling equipment may include a fan, a coil, or some combination of a fan and a coil. In one embodiment, the power distribution equipment may include a power strip with plug receptacles or a power busway.

Figure 15:
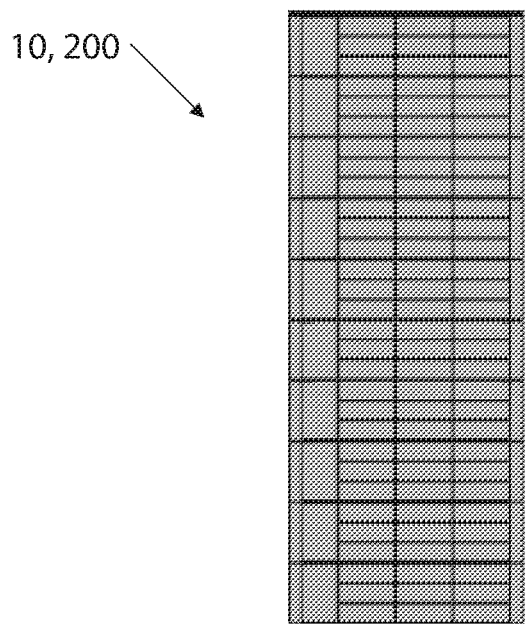
FIG. 15 is a front view diagram illustrating an example integration cell with plural electronic equipment chassis according to an embodiment of the invention.

FIG. 15 is a front view diagram illustrating an example integration cell 10 with plural electronic equipment chassis 200 according to an embodiment of the invention.

Figure 16:
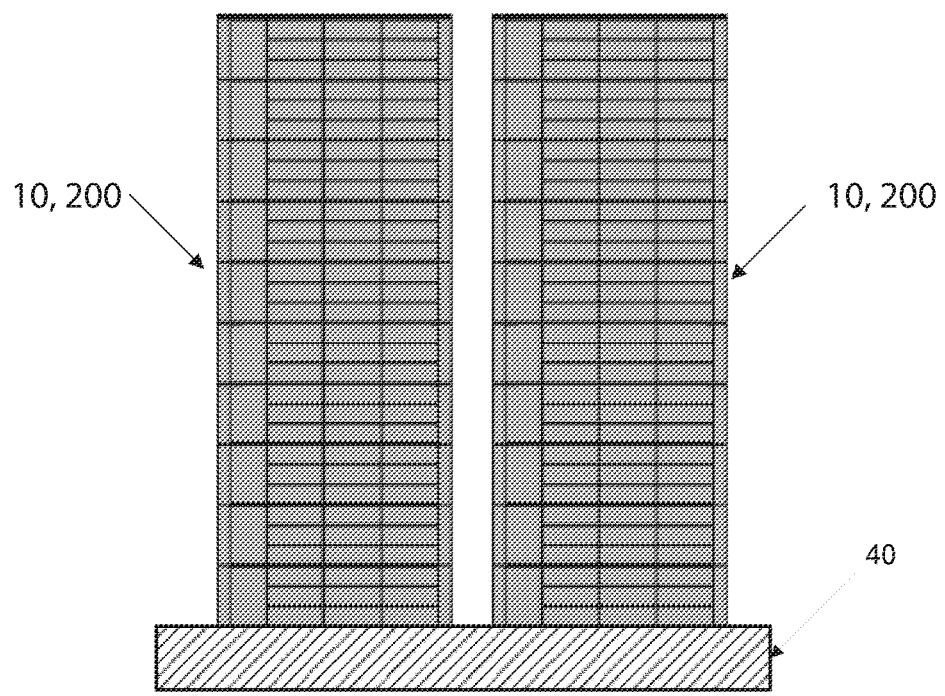
FIG. 16 is a front view diagram illustrating an example standard shipping palette that is an exemplary multimodal shipping unit loaded with plural integration cells with plural electronic equipment chassis according to an embodiment of the invention.

FIG. 16 is a front view diagram of a standard shipping palette 40 illustrating an exemplary multimodal shipping unit loaded with plural integration cells 10 with plural electronic equipment chassis 200 according to an embodiment of the invention. Advantageously, the integration cell 10 is sized such that two integration cells 10 can be placed side by side on a standard forty (40) inch wide shipping palette 40 or comparable sized shipping crate (not shown) and wrapped, coupled, or otherwise secured to the palette 40 or comparable sized shipping crate (not shown) without requiring individual packaging of the individual electronic equipment (not shown) and without individual packaging of the individual electronic equipment chassis 200, substantially decreasing shipping cost and packing material waste. Alternative multimodal shipping units of comparable size may also be utilized to attain the benefits of this consolidated platform that are not shown including shipping crates, shipping frames and other shipping apparatus.

Figure 17:
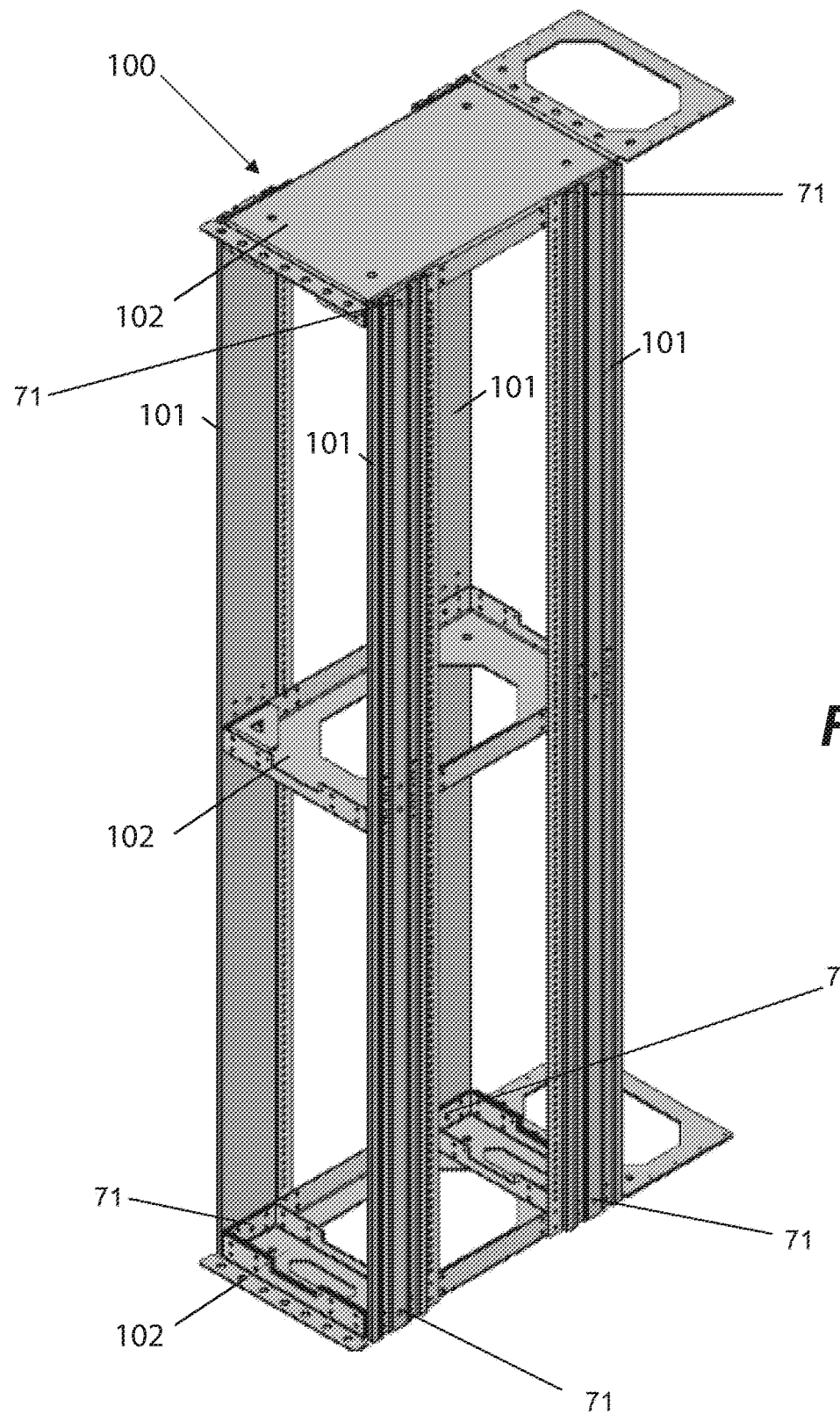
FIG. 17 is a perspective view diagram illustrating a building-block rack framework assembly, which is an example of a high-density equipment rack, according to an embodiment of the invention, having no integration cells.

FIG. 17 is a perspective view diagram illustrating an alternative implementation of a building-block rack framework assembly 100, which is generally similar to the implementation of FIG. 1, and is also referred to as a seismic electronic equipment storage rack or an electronic equipment rack. It is noted that while FIG. 17 provides the example of using a building-block rack framework assembly, the present invention is not limited to use of only seismic racks. In the illustrated embodiment, the building-block rack framework assembly 100 comprises four vertical structural side members 101 that are each secured to horizontal structural members 102. When the components of the building-block rack framework assembly 100 are secured together, they form a seismically stable structure into which one or more integration cells can be inserted and secured. Although the building-block rack framework assembly 100 is illustrated in a "two high" configuration, alternative configurations are also possible such as a "two wide" or a "three high" and the like. Advantageously, each building-block rack framework assembly 100 is configured to be secured to additional building-block rack framework assemblies 100 to provide a modular seismic electronic equipment storage rack system that is variable in both height and width. Additionally, advantageous is that the modular seismic electronic equipment storage rack system is also variable in density of electronic equipment by selective insertion of integrations cells into the rack system.

FIG. 17 also illustrates alignment and coupling holes 71, which are generally similar to holes 310 and 320, and which are used in the securing of individual building-block rack framework assemblies 100 to each other by one or more rack connectors 75, as illustrated hereafter, and as is described in additional detail in U.S. Pat. No. 9,532,484, which has been incorporated by reference herein in its entirety.

Figure 18:
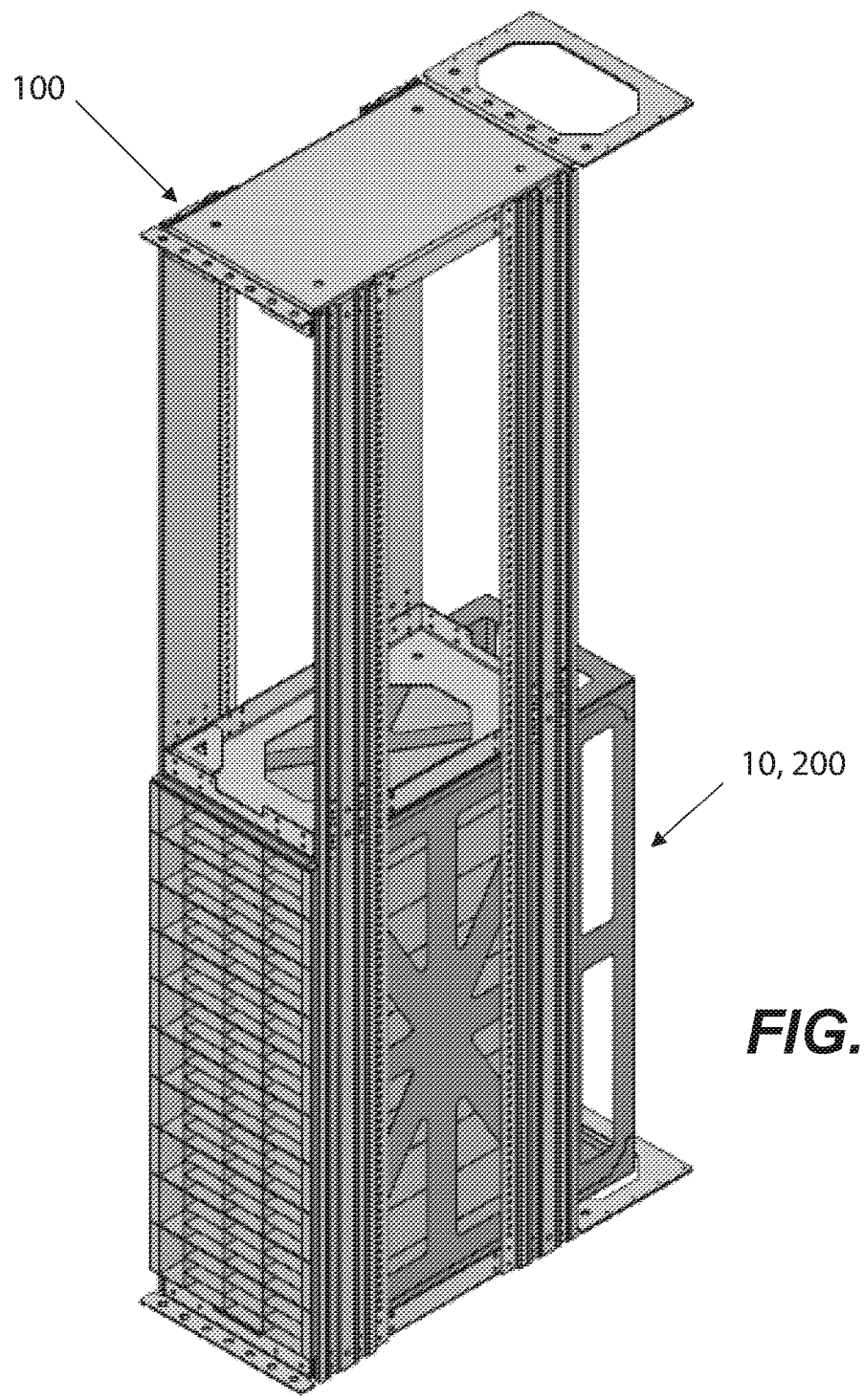
FIG. 18 is a perspective view diagram illustrating a building-block rack framework assembly partially filled with a single integration cell according to an embodiment of the invention.

FIG. 18 is a perspective view diagram illustrating an example building-block rack framework assembly 100 that is partially filled with a single integration cell 10 having plural electronic equipment chassis 200 according to an embodiment of the invention. Integration cell 10 is shown inserted into building block rack framework assembly 100 until rear building-block rack framework assembly stopper and mounting flange faces 22A and 22B in (see FIG. 11) is aligned and contacted with leading edge face 101B of vertical structural side member 101. Referring to FIG. 3A, the edge face of vertical structural side member 101 include a self-tapping screw receiver channel 305 formed in the front and rear leading edges vertical structural side member 101 to enable attachment of optional fitments including integration cell 10, in this implementation, with the use of self-tapping screws. Additionally, in this implementation the leading edge face 101B of vertical structural side member 101 provides a plurality of functions including not only fastening, but alignment and a stopping edge to facilitate insertion, alignment and mounting of integration cell 10 in this implementation.

Figure 19:
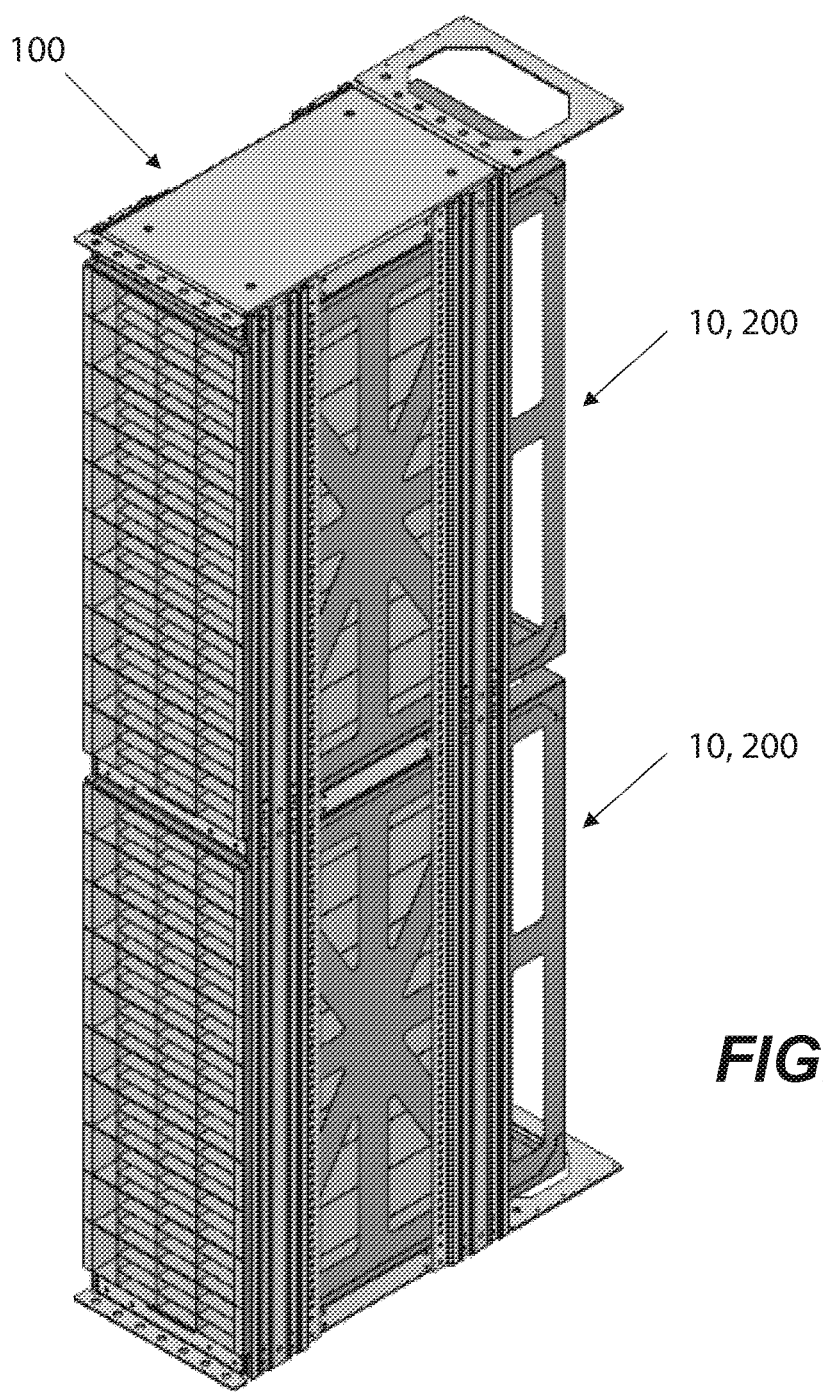
FIG. 19 is a perspective view diagram illustrating a building-block rack framework assembly completely filled with plural integration cells according to an embodiment of the invention.

FIG. 19 is a perspective view diagram illustrating an example building-block rack framework assembly 100 that is completely filled with plural integration cells 10, where each integration cell 10 has plural electronic equipment chassis 200 according to an embodiment of the invention.

Figure 20A:
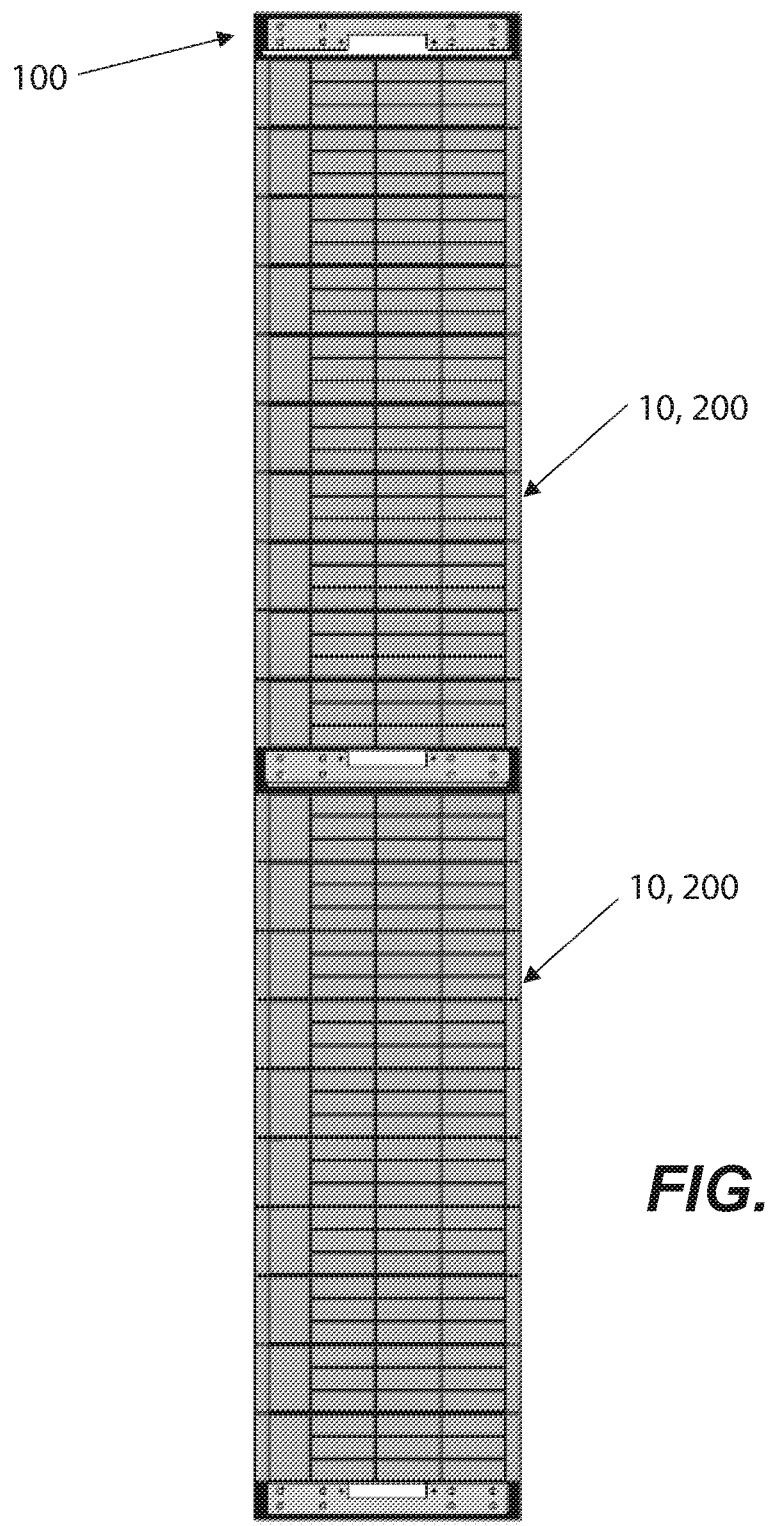
FIG. 20A is a front view diagram illustrating a building-block rack framework assembly completely filled with plural integration cells according to an embodiment of the invention.

FIG. 20A is a front view diagram illustrating an example seismic electronic equipment storage rack that is completely filled with plural integration cells 10, where each integration cell 10 has plural electronic equipment chassis 200 according to an embodiment of the invention.

Figure 20B:
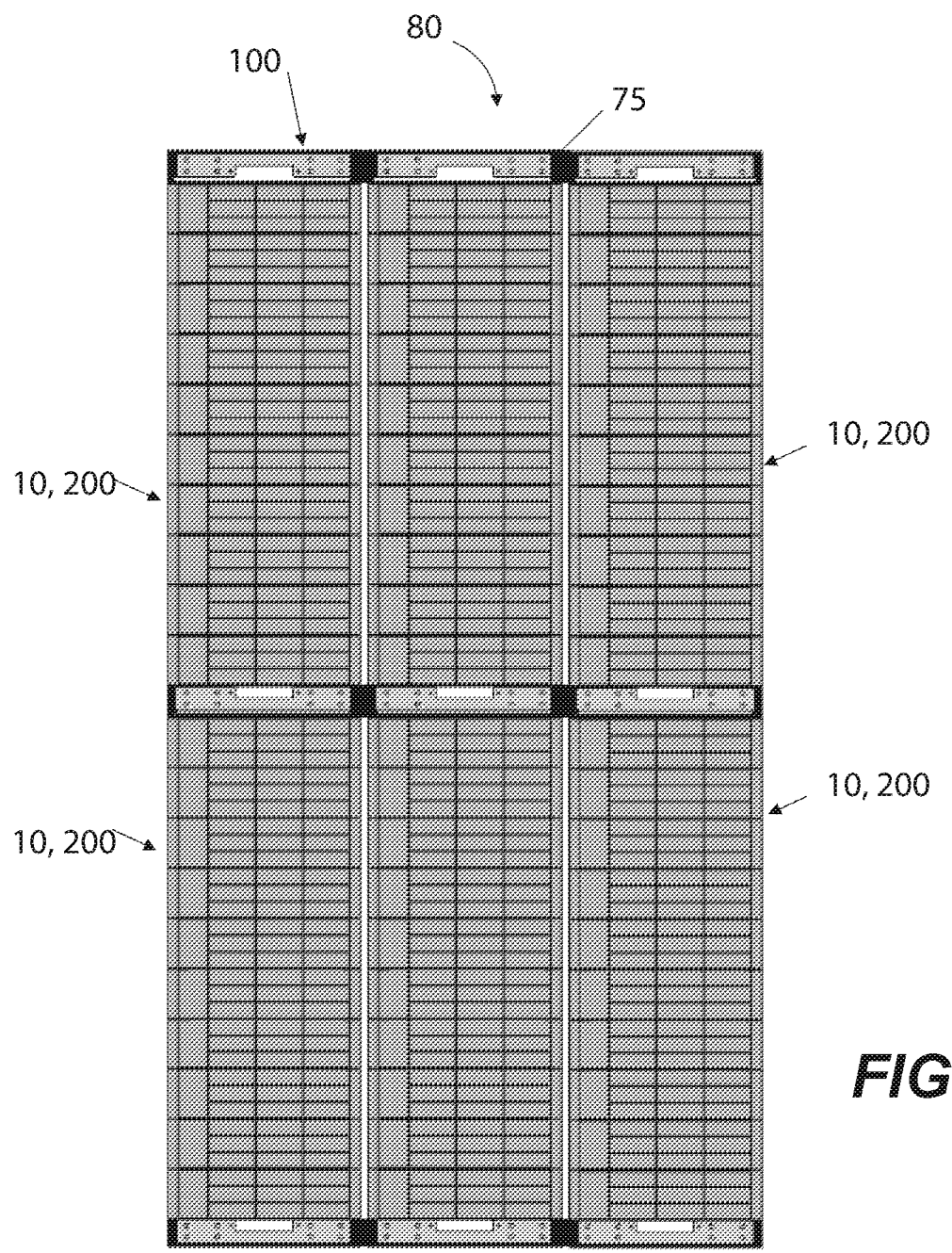
FIG. 20B is a front view diagram illustrating a building-block rack framework assembly completely filled with plural integration cells according to an embodiment of the invention.

FIG. 20B is a front view diagram illustrating an example seismic electronic equipment storage rack system 80 comprising a plurality of individual building-block rack framework assemblies 100 that are each completely filled with plural integration cells 10, where each integration cell 10 has plural electronic equipment chassis 200 according to an embodiment of the invention. In the illustrated embodiment, the individual building-block rack framework assemblies 100 are secured to each other via the coupling holes 71 and associated coupling means, which may comprise screws or some alternative form of fastener.

Figure 20C:
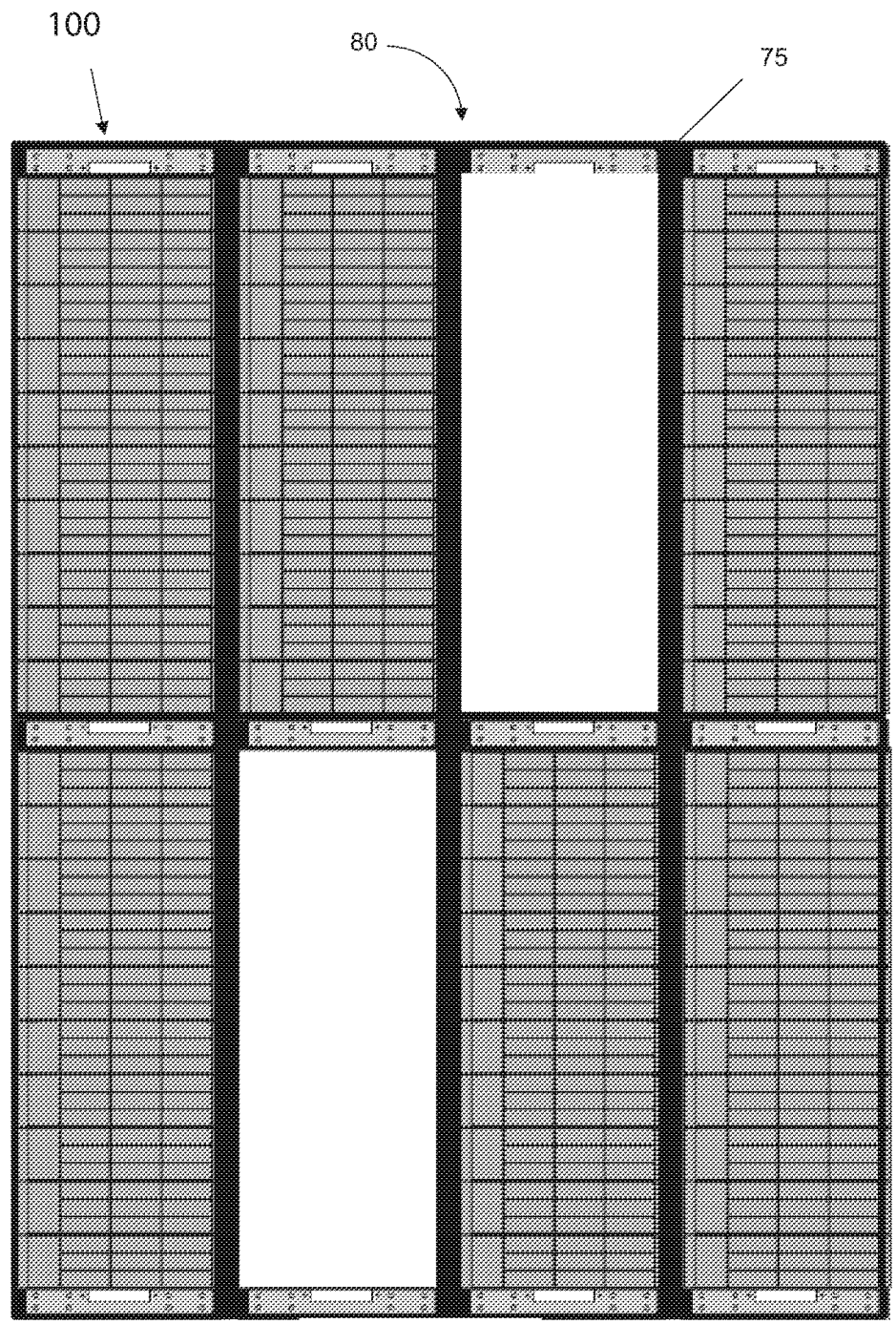
FIG. 20C is a front view diagram illustrating a building-block rack framework assembly system partially filled with plural integration cells according to an embodiment of the invention.

FIG. 20C is a front view diagram illustrating an example seismic electronic equipment storage rack system 80 comprising a plurality of individual building-block rack framework assemblies 100 according to an embodiment of the invention. Each of the individual building-block rack framework assemblies 100 are either completely filled or partially filled with one or more integration cells 10, where each integration cell 10 has one or more electronic equipment chassis 200. In the illustrated embodiment, the individual building-block rack framework assemblies 100 are secured to each other by one or more rack connectors 75, which may comprise screws or some alternative form of fastener.

Figure 21:
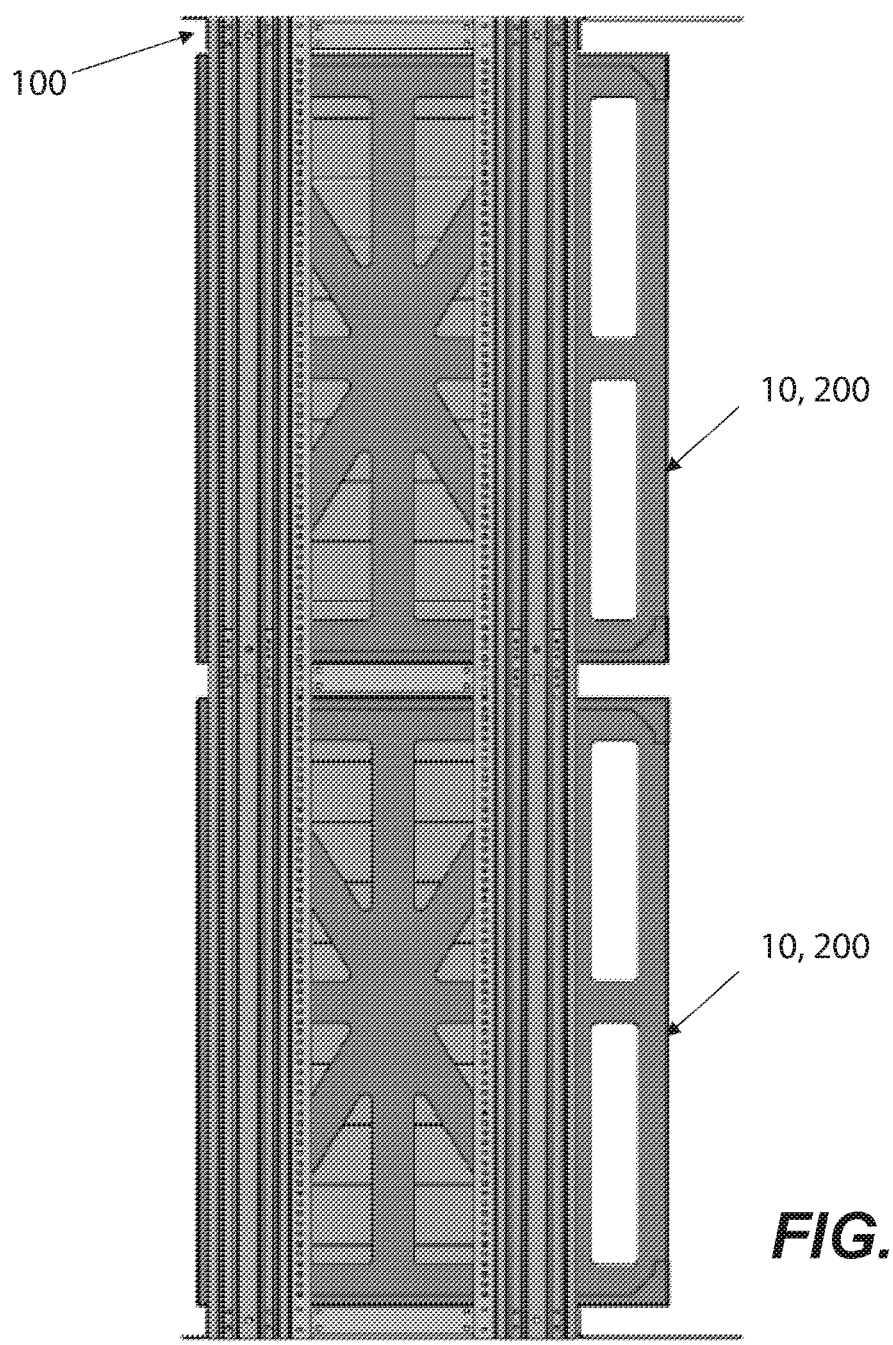
FIG. 21 is a side view diagram illustrating a building-block rack framework assembly completely filled with plural integration cells according to an embodiment of the invention.

FIG. 21 is a side view diagram illustrating an example building-block rack framework assembly 100 that is completely filled with plural integration cells 10, where each integration cell 10 has plural electronic equipment chassis 200 according to an embodiment of the invention.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly not limited.

What is claimed is:

1. A method of transporting electronic equipment units using a seismic modular electronic storage rack assembly and an integration cell for mounting and transporting electronic equipment, said method comprising:
    securing one or more electronic equipment units in the integration cell, where the integration cell includes a housing comprising:
        a top wall;
        a bottom wall disposed opposite the top wall;
        a first side wall;
        a second side wall disposed opposite the first side wall; and
        one or more stopper flanges positioned along a front edge of the first side wall and the second side wall,
    wherein the first and second side walls are connected to the top wall and bottom walls on opposite sides to define a rectangular cavity having a cavity width comprising a distance between the first side wall and the second side wall and a cavity height comprising a distance between the top wall and the bottom wall,
    wherein the integration cell is configured to support one or more electronic equipment units within the rectangular cavity,
    wherein the integration cell is configured to be accepted in the seismic modular electronic storage rack assembly with the one or more stopper flanges configured to engage at least one surface of the seismic modular equipment storage rack and to be secured in the seismic modular electronic equipment storage rack;
    securing the integration cell on a shipping palette or shipping crate;
    shipping the loaded shipping palette or shipping crate to a destination;
    removing the integration cell from the shipping palette or shipping crate; and
    installing the integration cell in the seismic modular electronic storage rack assembly, where the seismic modular electronic storage rack assembly comprises
        a plurality of vertical structural side members,
        a plurality of horizontal structural members coupled to the plurality of vertical structural side members, each of the horizontal structural members having a front face, a back face, a first side face and a second side face, wherein the plurality of horizontal structural members include at least a first horizontal structural member, a second horizontal structural member and a third horizontal structural member wherein the second horizontal structure is positioned between the first and third horizontal structures of the storage rack assembly, and wherein
        a first vertical structural side member is coupled to each of the horizontal structural members on respective first side faces and positioned proximal to the front face, and
        a second vertical structural side member is coupled to each of the horizontal structural members on respective first side faces and positioned proximal to the back face, and
        a third vertical structural side member is coupled to each of the horizontal structural members on respective second side faces and positioned proximal to the back face, and
        a fourth vertical structural side member is coupled to each of the horizontal structural members on respective second side faces and positioned proximal to the front face,
        a first seismic anchor plate coupled to the front face of the first horizontal structural member between the first vertical structural side member and the fourth vertical structural side member; and
        one or more seismic adaptor kits comprising a plurality of seismic adaptor brackets and at least one seismic brace, wherein each seismic adaptor bracket is configured for mounting to a front surface of a seismic anchor plate or a front or rear face of a horizontal structural member,
    wherein a first seismic adaptor kit comprises a first seismic brace adapted to couple between a first seismic adaptor bracket and a second seismic adaptor bracket, wherein the first seismic adaptor bracket is coupled to the first seismic anchor plate proximal to the first vertical structural side member, and wherein the second seismic adaptor bracket is coupled to the second horizontal structural member proximal to the fourth vertical structural side member, and the first seismic adaptor kit further comprises a second seismic brace adapted to couple between the second seismic adaptor bracket and a third seismic adaptor bracket, wherein the third seismic adaptor bracket is coupled to the third horizontal structural member proximal to the first vertical structural side member.

2. The method of claim 1, wherein the shipping palette or the shipping crate is forty inches wide.

3. The method of claim 1, further comprising wrapping or coupling the integration cell to the shipping palette or shipping crate without individual packaging of individual electronic equipment.

4. The method of claim 1, where the integration cell is a first integration cell, and where said method further comprises securing a second integration cell on the shipping palette or shipping crate side-by-side with the first integration cell.

5. The method of claim 4, further comprising wrapping or coupling the first integration cell and the second integration cell to the shipping palette or shipping crate without individual packaging of individual electronic equipment.

6. A system comprising a seismic modular electronic storage rack assembly and an integration cell for mounting and transporting electronic equipment:
    where the seismic modular electronic storage rack assembly comprises
        a plurality of vertical structural side members,
        a plurality of horizontal structural members coupled to the plurality of vertical structural side members, each of the horizontal structural members having a front face, a back face, a first side face and a second side face, wherein the plurality of horizontal structural members include at least a first horizontal structural member, a second horizontal structural member and a third horizontal structural member wherein the second horizontal structure is positioned between the first and third horizontal structures of the storage rack assembly, and wherein
- a first vertical structural side member is coupled to each of the horizontal structural members on respective first side faces and positioned proximal to the front face, and
- a second vertical structural side member is coupled to each of the horizontal structural members on respective first side faces and positioned proximal to the back face, and
- a third vertical structural side member is coupled to each of the horizontal structural members on respective second side faces and positioned proximal to the back face, and
- a fourth vertical structural side member is coupled to each of the horizontal structural members on respective second side faces and positioned proximal to the front face, a first seismic anchor plate coupled to the front face of the first horizontal structural member between the first vertical structural side member and the fourth vertical structural side member; and one or more seismic adaptor kits comprising a plurality of seismic adaptor brackets and at least one seismic brace, wherein each seismic adaptor bracket is configured for mounting to a front surface of a seismic anchor plate or a front or rear face of a horizontal structural member, wherein a first seismic adaptor kit comprises a first seismic brace adapted to couple between a first seismic adaptor bracket and a second seismic adaptor bracket, wherein the first seismic adaptor bracket is coupled to the first seismic anchor plate proximal to the first vertical structural side member, and wherein the second seismic adaptor bracket is coupled to the second horizontal structural member proximal to the fourth vertical structural side member, and the first seismic adaptor kit further comprises a second seismic brace adapted to coupled between the second seismic adaptor bracket and a third seismic adaptor bracket, wherein the third seismic adaptor bracket is coupled to the third horizontal structural member proximal to the first vertical structural side member, and wherein the integration cell includes a housing comprising:
- a top wall;
- a bottom wall disposed opposite the top wall;
- a first side wall;
- a second side wall disposed opposite the first side wall; and
- one or more stopper flanges positioned along a front edge of the first side wall and the second side wall, wherein the first and second side walls are connected to the top wall and bottom walls on opposite sides to define a rectangular cavity having a cavity width comprising a distance between the first side wall and the second side wall and a cavity height comprising a distance between the top wall and the bottom wall, wherein the integration cell is configured to support one or more electronic equipment units within the rectangular cavity, wherein the integration cell is configured to be accepted in the seismic modular electronic storage rack assembly with the one or more stopper flanges configured to engage at least one surface of the seismic modular equipment storage rack and to be secured in the seismic modular electronic equipment storage rack, and wherein, when the integration cell supports one or more electronic equipment units and when the integration cell is accepted in the seismic modular electronic storage rack assembly, the housing protects the one or more electronic equipment units during transportation of the seismic modular electronic storage rack assembly, the accepted integration cell, and the supported one or more electronic equipment units.

7. The system of claim 6, wherein the one or more stopper flanges of the integration cell are configured to engage and align at least one surface of an electronic equipment chassis to prevent further ingress of the electronic equipment chassis into the rectangular cavity when the electronic equipment chassis is installed into the integration cell, and wherein the electronic equipment chassis is configured to store one or more electronic equipment units.

8. The system of claim 6, wherein the housing further comprises one or more stopper flanges of the integration cell are configured to engage a surface of the seismic modular electronic storage rack assembly to prevent further ingress of the integration cell into an opening of the seismic modular electronic storage rack assembly when the integration cell is installed into the seismic modular electronic storage rack assembly.

9. The system of claim 6, wherein the housing of the integration cell further comprises one or more electronic equipment chassis mounting flanges for securing an electronic equipment chassis to the integration cell.

10. The system of claim 6, wherein the width of the integration cell is less than half of the width of a 40 inch wide shipping palette or is less than half of the width of a 40 inch wide shipping crate.

11. The system of claim 6, further comprising at least one optional fitment for attachment to the seismic modular electronic storage rack assembly.

12. The system of claim 6, wherein the seismic modular electronic storage rack assembly has a width of 480 mm to 500 mm, and where the integration cell is configured to support one or more electronic equipment units having a standard width of approximately 450 mm.

13. The system of claim 6, wherein the integration cell is configured to be mounted in the seismic modular electronic storage rack assembly without increasing an exterior width of the seismic modular electronic storage rack assembly.

14. The system of claim 6, wherein the integration cell is accepted within the seismic modular electronic storage rack assembly, with the one or more stopper flanges of the integration cell engaging at least one surface of the seismic modular equipment storage rack.

15. The system of claim 6, wherein the integration cell is a first integration cell, wherein the system further comprises a second integration cell, and wherein the first integration cell and the second integration cell are each disposed within the seismic modular electronic storage rack assembly.

16. The system of claim 6, further including one or more electronic equipment units,
- wherein the integration cell supports the one or more electronic equipment units, and
- wherein the integration cell is accepted in the seismic modular electronic storage rack assembly.

17. The system of claim 6, wherein, for the seismic modular electronic storage rack assembly, a first set of the vertical structural members, horizontal structural members, and at least one of the one or more seismic adaptor kits are configured to be assembled into a column, the rack assembly further comprising a plurality of columns coupled together.

18. The system of claim 17, wherein, for the seismic modular electronic storage rack assembly, each column comprises four of the plurality of vertical structural side members coupled to at least two of the plurality of horizontal structural members.

19. The system of claim 17, wherein, for the seismic modular electronic storage rack assembly, the plurality of columns is coupled together side-by-side or stacked vertically.

20. The system of claim 17, wherein, for the seismic modular electronic storage rack assembly, wherein one or more of the horizontal structural members in each column includes at least one modular coupling hole used in aligning and coupling the plurality of columns together.

\* \* \* \* \*